US005601966A

United States Patent [19]

Kumar et al.

[11] Patent Number: 5,601,966

[45] Date of Patent: Feb. 11, 1997

[54] METHODS FOR FABRICATING FLAT PANEL DISPLAY SYSTEMS AND COMPONENTS

[75] Inventors: Nalin Kumar, Austin; Chenggang Xie, Cedar Park, both of Tex.

[73] Assignee: Microelectronics and Computer Technology Corporation, Austin, Tex.

[21] Appl. No.: 475,167

[22] Filed: Jun. 7, 1995

Related U.S. Application Data

[62] Division of Ser. No. 147,700, Nov. 4, 1993, abandoned.

[51] Int. Cl.[6] .......... G03F 7/00

[52] U.S. Cl. .......... 430/313; 430/318; 430/323; 430/320; 156/625.1; 156/644.1; 216/41; 427/259; 427/272

[58] Field of Search .......... 430/311, 313, 430/318, 320, 323; 156/625.1, 644.1; 216/41; 427/259, 272

[56] References Cited

U.S. PATENT DOCUMENTS

| | | | |
|---|---|---|---|
| 1,954,691 | 4/1934 | Hendrick de Boer et al. | 250/34 |
| 2,851,408 | 9/1958 | Cerulli et al. | 204/181 |
| 2,867,541 | 1/1959 | Coghill et al. | 117/33.5 |

(List continued on next page.)

FOREIGN PATENT DOCUMENTS

| | | |
|---|---|---|
| 8807288 | 12/1989 | France . |
| 57-141480 | 9/1982 | Japan . |
| 57-141482 | 9/1982 | Japan . |
| 58-102444 | 6/1983 | Japan . |
| 58-164133 | 9/1983 | Japan . |
| 59-075547 | 4/1984 | Japan . |
| 59-075548 | 4/1984 | Japan . |
| 59-209249 | 11/1984 | Japan . |
| 60-009039 | 1/1985 | Japan . |
| 60-049553 | 3/1985 | Japan . |
| 60-115682 | 6/1985 | Japan . |
| 62-027486 | 2/1987 | Japan . |
| 62-121783 | 6/1987 | Japan . |
| 63-251491 | 10/1988 | Japan . |
| 64-043595 | 2/1989 | Japan . |
| 3-127431 | 5/1991 | Japan . |
| 3-119640 | 5/1991 | Japan . |
| 3-137190 | 6/1991 | Japan . |
| 4-202493 | 7/1992 | Japan . |
| 4-227678 | 8/1992 | Japan . |
| 4-227785 | 8/1992 | Japan . |
| 4-233991 | 8/1992 | Japan . |
| 4-230996 | 8/1992 | Japan . |
| 4-270783 | 9/1992 | Japan . |
| 5-065478 | 3/1993 | Japan . |
| 5-117653 | 5/1993 | Japan . |
| 5-117655 | 5/1993 | Japan . |

OTHER PUBLICATIONS

"A new vacuum-etched high-transmittance (antireflection) film," *Appl. Phys. Lett.*, 1980, pp. 727–730.

"A Silicon Field Emitter Array Planar Vacuum FET Fabricated with Microfabrication Techniques," *Mat. Res. Soc. Symp. Proc.*, vol. 76, 1987, pp. 25–30.

"A Technique for Controllable Seeding of Ultrafine Diamond Particles for Growth and Selective-Area Deposition of Diamond Films," *2nd International Conference on the Applications of Diamond Films and Related Materials*, 1993, pp. 475–480.

"Computer Simulations in the Design of Ion Beam Deflection Systems," *Nuclear Instruments and Methods in Physics Research*, vol. B10, No. 11, 1985, pp. 817–821.

"Cone formation as a result of whisker growth on ion bombarded metal surfaces," *J. Vac. Sci. Technol. A*, vol. 3, No. 4, Jul./Aug. 1985, pp. 1821–1834.

"Cone Formation on Metal Targets During Sputtering," *J. Appl. Physics*, vol. 42, No. 3, Mar. 1, 1971, pp. 1145–1149.

"Control of silicon field emitter shape with isotrophically etched oxide masks," *Inst. Phys. Conf. Ser. No. 99: Section 2*, Presented at 2nd Int. Conf. on Vac. Microelectron., Bath, 1989, pp. 37–40.

"Deposition of diamond-like carbon," *Phil. Trans. R. Soc. Land. A*, vol. 342, 1993, pp. 277–286.

"Fabrication of encapsulated silicon-vacuum field-emission transistors and diodes", *J. Vac. Sci. Technol. B*, vol. 10, No. 6, Nov./Dec. 1992, pp. 2984–2988.

"Fabrication of gated silicon field-emission cathodes for vacuum microelectronics and electron-beam applications," *J. Vac. Sci. Technol. B*, vol. 11, No. 2, Mar./Apr. 1993, pp. 454–458.

"Fabrication of silicon field emission points for vacuum microelectronics by wet chemical etching," *Semicond. Sci. Technol.*, vol. 6, 1991, pp. 223–225.

"Fabrication of 0.4 μm grid apertures for field-emission array cathodes," *Microelectronic Engineering*, vol. 21, 1993, pp. 467–470.

"Growth of diamond particles on sharpened silicon tips," *Materials Letters*, vol. 18, No. 1.2, 1993, pp. 61–63.

"Interference and diffraction in globular metal films," *J. Opt. Soc. Am.*, vol. 68, No. 8, Aug. 1978, pp. 1023–1031.

"Oxidation sharpening of silicon tips," *J. Vac. Sci. Technol. B*, vol. 9, No. 6, Nov./Dec. 1991, pp. 2733–2737.

"Physical properties of thin film field emission cathodes with molybdenum cones," *J. Appl. Physics*, vol. 47, No. 12, 1976, pp. 5248–5263.

(List continued on next page.)

*Primary Examiner*—Kathleen Duda
*Attorney, Agent, or Firm*—Kelly K. Kordzik; Winstead Sechrest & Minick P.C.

[57] ABSTRACT

A method is provided for fabricating a display cathode which includes forming a conductive line adjacent a face of a substrate. A region of amorphic diamond is formed adjacent a selected portion of the conductive line.

38 Claims, 7 Drawing Sheets

U.S. PATENT DOCUMENTS

| | | | |
|---|---|---|---|
| 2,959,483 | 11/1960 | Kaplan | 96/34 |
| 3,070,441 | 12/1962 | Schwartz | 96/35 |
| 3,108,904 | 10/1963 | Cusano | 117/211 |
| 3,259,782 | 7/1966 | Shroff | 313/336 |
| 3,314,871 | 4/1967 | Heck et al. | 204/181 |
| 3,360,450 | 12/1967 | Hays | 204/181 |
| 3,525,679 | 8/1970 | Wilcox et al. | 204/181 |
| 3,554,889 | 1/1971 | Hyman et al. | 204/181 |
| 3,665,241 | 5/1972 | Spindt et al. | 313/351 |
| 3,675,063 | 7/1972 | Spindt et al. | 313/104 |
| 3,755,704 | 8/1973 | Spindt et al. | 313/309 |
| 3,789,471 | 2/1974 | Spindt et al. | 29/25.17 |
| 3,808,048 | 4/1974 | Strik | 117/226 |
| 3,812,559 | 5/1974 | Spindt et al. | 445/52 |
| 3,855,499 | 12/1974 | Yamada et al. | 313/351 X |
| 3,898,146 | 8/1975 | Rehkopf et al. | 204/181 |
| 3,947,716 | 3/1976 | Fraser, Jr. et al. | 427/78 |
| 3,970,887 | 7/1976 | Smith et al. | 313/309 |
| 3,998,678 | 12/1976 | Fukase et al. | 156/3 |
| 4,008,412 | 7/1977 | Yuito et al. | 313/309 |
| 4,075,535 | 2/1978 | Genequand et al. | 313/422 |
| 4,084,942 | 4/1978 | Villalobos | 51/307 |
| 4,139,773 | 2/1979 | Swanson | 250/423 |
| 4,141,405 | 2/1979 | Spindt | 164/46 |
| 4,143,292 | 3/1979 | Hosoki et al. | 313/336 |
| 4,164,680 | 8/1979 | Villalobos | 313/336 |
| 4,168,213 | 9/1979 | Hoeberechts | 204/15 |
| 4,178,531 | 12/1979 | Alig | 313/309 X |
| 4,307,507 | 12/1981 | Gray et al. | 29/580 |
| 4,350,926 | 9/1982 | Shelton | 313/455 |
| 4,482,447 | 11/1984 | Mizuguchi et al. | 204/181 |
| 4,498,952 | 2/1985 | Christensen | 156/643 |
| 4,507,562 | 3/1985 | Gasiot et al. | 250/484.1 |
| 4,512,912 | 4/1985 | Matsuda et al. | 252/301.6 S |
| 4,513,308 | 4/1985 | Greene et al. | 313/309 X |
| 4,540,983 | 9/1985 | Morimoto et al. | 340/772 |
| 4,542,038 | 9/1985 | Odaka et al. | 427/68 |
| 4,578,614 | 3/1986 | Gray et al. | 313/309 |
| 4,588,921 | 5/1986 | Tischer | 313/496 |
| 4,594,527 | 6/1986 | Genevese | 313/493 |
| 4,633,131 | 12/1986 | Khurgin | 313/474 |
| 4,647,400 | 3/1987 | Dubroca et al. | 252/301.16 |
| 4,663,559 | 5/1987 | Christensen | 313/336 |
| 4,684,353 | 8/1987 | deSouza | 445/51 |
| 4,684,540 | 8/1987 | Schulze | 427/71 |
| 4,685,996 | 8/1987 | Busta et al. | 156/628 |
| 4,687,825 | 8/1987 | Sagou et al. | 427/71 X |
| 4,687,938 | 8/1987 | Tamura et al. | 250/423 |
| 4,710,765 | 12/1987 | Ohkoshi et al . | 340/781 |
| 4,721,885 | 1/1988 | Brodie | 313/576 |
| 4,728,851 | 3/1988 | Lambe | 313/309 |
| 4,758,449 | 7/1988 | Kimura et al. | 427/71 X |
| 4,763,187 | 8/1988 | Biberian | 358/56 |
| 4,780,684 | 10/1988 | Kosmahl | 350/54 |
| 4,788,472 | 11/1988 | Katakami | 313/496 |
| 4,816,717 | 3/1989 | Harper et al. | 313/509 X |
| 4,818,914 | 4/1989 | Brodie | 315/169.3 |
| 4,822,466 | 4/1989 | Rabalais et al. | 204/192.15 |
| 4,827,177 | 5/1989 | Lee et al. | 313/306 |
| 4,835,438 | 5/1989 | Baptist et al. | 313/309 |
| 4,851,254 | 7/1989 | Yamamoto et al. | 427/450 |
| 4,855,636 | 8/1989 | Busta et al. | 313/306 |
| 4,857,161 | 8/1989 | Borel et al. | 204/192.26 |
| 4,857,799 | 8/1989 | Spindt et al. | 313/495 |
| 4,874,981 | 10/1989 | Spindt | 313/309 |
| 4,882,659 | 11/1989 | Gloudemans | 362/61 |
| 4,889,690 | 12/1989 | Opitz et al. | 422/73 |
| 4,892,757 | 1/1990 | Kasenga et al. | 427/215 |
| 4,899,081 | 2/1990 | Kishino et al. | 313/496 |
| 4,900,584 | 2/1990 | Tuenge et al. | 427/66 |
| 4,908,539 | 3/1990 | Meyer | 315/169.3 |
| 4,923,421 | 5/1990 | Brodie et al. | 445/24 |
| 4,926,056 | 5/1990 | Spindt | 313/230 |
| 4,933,108 | 6/1990 | Soredal | 252/518 |
| 4,940,916 | 7/1990 | Borel et al. | 313/306 |
| 4,943,343 | 7/1990 | Bardai et al. | 156/643 |
| 4,956,202 | 9/1990 | Kasenga et al. | 427/215 |
| 4,956,574 | 9/1990 | Kane | 313/306 |
| 4,964,946 | 10/1990 | Gray et al. | 156/643 |
| 4,987,007 | 1/1991 | Wagal et al. | 427/53.1 |
| 4,990,416 | 2/1991 | Mooney | 430/26 |
| 4,990,766 | 2/1991 | Simms et al. | 250/213 VT |
| 4,994,205 | 2/1991 | Towers | 252/301.4 F |
| 5,007,873 | 4/1991 | Goronkin et al. | 445/49 |
| 5,015,912 | 5/1991 | Spindt et al. | 313/309 X |
| 5,019,003 | 5/1991 | Chason | 445/24 |
| 5,036,247 | 7/1991 | Watanabe et al. | 313/496 X |
| 5,038,070 | 8/1991 | Bardai et al. | 313/309 |
| 5,043,715 | 8/1991 | Kun et al. | 340/781 |
| 5,054,046 | 10/1991 | Shoulders | 313/306 |
| 5,054,047 | 10/1991 | Shoulders | 313/306 X |
| 5,055,077 | 10/1991 | Kane et al. | 445/50 |
| 5,055,744 | 10/1991 | Tsuruoka | 313/497 X |
| 5,057,047 | 10/1991 | Greene et al. | 445/24 |
| 5,063,323 | 11/1991 | Longo et al. | 313/309 |
| 5,063,327 | 11/1991 | Brodie et al. | 313/482 |
| 5,064,396 | 11/1991 | Spindt | 445/50 |
| 5,066,883 | 11/1991 | Yoshioka et al. | 313/309 |
| 5,075,591 | 12/1991 | Holmberg | 313/495 |
| 5,075,595 | 12/1991 | Kane | 315/169.1 |
| 5,075,596 | 12/1991 | Young et al. | 315/169.3 |
| 5,079,476 | 1/1992 | Kane | 313/308 |
| 5,085,958 | 2/1992 | Jeong | 430/25 |
| 5,089,292 | 2/1992 | MaCaulay et al. | 427/78 |
| 5,089,742 | 2/1992 | Kirkpatrick et al. | 313/351 |
| 5,089,812 | 2/1989 | Fuse | 345/89 |
| 5,090,932 | 2/1992 | Dieumegard et al. | 445/24 |
| 5,098,737 | 3/1992 | Collins et al. | 427/53.1 |
| 5,101,137 | 3/1992 | Kun et al. | 313/509 |
| 5,101,288 | 3/1992 | Ohta et al. | 359/54 |
| 5,103,144 | 4/1992 | Dunham | 315/366 |
| 5,103,145 | 4/1992 | Doran | 315/381 |
| 5,117,267 | 5/1992 | Kimoto et al. | 357/16 |
| 5,117,299 | 5/1992 | Kondo et al. | 359/58 |
| 5,119,386 | 6/1992 | Narusawa | 357/16 |
| 5,123,039 | 6/1992 | Shoulders | 313/306 X |
| 5,124,072 | 6/1992 | Dole et al. | 252/301.4 F |
| 5,124,558 | 6/1992 | Soltani et al. | 250/484.1 |
| 5,126,287 | 6/1992 | Jones | 437/228 |
| 5,129,850 | 7/1992 | Kane et al. | 445/24 |
| 5,132,585 | 7/1992 | Kane et al. | 313/44 |
| 5,132,676 | 7/1992 | Kimura et al. | 359/58 X |
| 5,136,764 | 8/1992 | Vasquez | 29/25.01 |
| 5,138,237 | 8/1992 | Kane et al. | 315/349 |
| 5,140,219 | 8/1992 | Kane | 313/495 |
| 5,141,459 | 8/1992 | Zimmerman | 445/50 X |
| 5,141,460 | 8/1992 | Jaskie et al. | 445/24 |
| 5,142,184 | 8/1992 | Kane | 313/309 |
| 5,142,256 | 8/1992 | Kane | 333/262 |
| 5,142,390 | 8/1992 | Ohta et al. | 359/58 |
| 5,144,191 | 9/1992 | Jones et al. | 313/308 |
| 5,148,078 | 9/1992 | Kane | 313/307 |
| 5,148,461 | 9/1992 | Shoulders | 313/306 X |
| 5,150,011 | 9/1992 | Fujieda | 315/169.4 |
| 5,150,192 | 9/1992 | Greene et al. | 357/68 |
| 5,151,061 | 9/1992 | Sandhu | 445/50 X |
| 5,153,753 | 10/1992 | Ohta et al. | 359/58 |
| 5,153,901 | 10/1992 | Shoulders | 313/306 X |
| 5,155,420 | 10/1992 | Smith | 315/349 |
| 5,156,770 | 10/1992 | Wetzel et al. | 252/510 |
| 5,157,304 | 10/1992 | Kane et al. | 313/495 |
| 5,157,309 | 10/1992 | Parker et al. | 315/169.1 |

| | | | |
|---|---|---|---|
| 5,162,704 | 11/1992 | Kobori et al. | 315/349 |
| 5,166,456 | 11/1992 | Masahiko | 252/301.4 S |
| 5,173,634 | 12/1992 | Kane | 313/306 |
| 5,173,635 | 12/1992 | Kane | 313/309 |
| 5,173,697 | 12/1992 | Smith et al. | 341/133 |
| 5,180,951 | 1/1993 | Dworsky et al. | 315/169.3 |
| 5,183,529 | 2/1993 | Potter et al. | 156/613 |
| 5,185,178 | 2/1993 | Koskenmaki | 427/585 |
| 5,186,670 | 2/1993 | Doan et al. | 445/50 X |
| 5,187,578 | 2/1993 | Kohgami et al. | 358/168 |
| 5,191,217 | 3/1993 | Kane et al. | 250/423 F |
| 5,192,240 | 3/1993 | Komatsu | 445/24 |
| 5,194,780 | 3/1993 | Meyer | 315/169.3 |
| 5,199,917 | 4/1993 | MacDonald et al. | 445/50 |
| 5,199,918 | 4/1993 | Kumar | 445/50 |
| 5,201,992 | 4/1993 | Marcus et al. | 156/643 |
| 5,202,571 | 4/1993 | Hinabayashi et al. | 313/446 X |
| 5,203,731 | 4/1993 | Zimmerman | 445/24 |
| 5,204,021 | 4/1993 | Dole | 252/301.4 R |
| 5,204,581 | 4/1993 | Andreadakis et al. | 313/309 X |
| 5,205,770 | 4/1993 | Lowrey et al. | 445/24 |
| 5,209,687 | 5/1993 | Konishi | 445/6 |
| 5,210,430 | 5/1993 | Taniguchi et al. | 313/509 X |
| 5,210,462 | 5/1993 | Konishi | 313/495 |
| 5,212,426 | 5/1993 | Kane | 313/309 X |
| 5,213,712 | 5/1993 | Dole | 252/301.4 R |
| 5,214,346 | 5/1993 | Komatsu | 313/309 |
| 5,214,347 | 5/1993 | Gray | 313/355 |
| 5,214,416 | 5/1993 | Kondo et al. | 340/766 |
| 5,220,725 | 6/1993 | Chan et al. | 29/874 |
| 5,227,699 | 7/1993 | Busta | 315/291 |
| 5,228,878 | 7/1993 | Komatsu | 445/24 |
| 5,229,331 | 7/1993 | Doan et al. | 437/228 |
| 5,229,682 | 7/1993 | Komatsu | 313/309 |
| 5,231,606 | 7/1993 | Gray | 365/225.6 |
| 5,232,549 | 8/1993 | Cathey et al. | 456/633 |
| 5,233,263 | 8/1993 | Cronin et al. | 313/309 |
| 5,235,244 | 8/1993 | Spindt | 313/309 X |
| 5,236,545 | 8/1993 | Pryor | 156/613 |
| 5,242,620 | 9/1973 | Dole et al. | 252/301.4 R |
| 5,243,252 | 9/1993 | Kaneko et al. | 313/309 |
| 5,250,451 | 10/1993 | Chouan | 437/40 |
| 5,252,833 | 10/1993 | Kane et al. | 250/423 F |
| 5,256,888 | 10/1993 | Kane | 313/309 X |
| 5,259,799 | 11/1993 | Doan et al. | 445/50 X |
| 5,262,698 | 11/1993 | Dunham | 315/169.1 |
| 5,266,155 | 11/1993 | Gray | 156/651 |
| 5,275,967 | 1/1994 | Taniguchi et al. | 437/127 |
| 5,276,521 | 1/1994 | Mori et al. | 348/243 |
| 5,277,638 | 1/1994 | Lee | 445/50 X |
| 5,278,475 | 1/1994 | Jaskie et al. | 315/169.3 |
| 5,281,890 | 1/1994 | Kane | 313/309 |
| 5,281,891 | 1/1994 | Kaneko et al. | 313/309 |
| 5,283,500 | 2/1994 | Kochanski | 313/309 X |
| 5,285,129 | 2/1994 | Takeda et al. | 313/309 X |
| 5,288,877 | 7/1993 | Allaway et al. | 445/50 |
| 5,296,117 | 3/1994 | De Jaeger et al. | 204/181.5 |
| 5,300,862 | 4/1994 | Parker et al. | 315/169.1 |
| 5,302,423 | 4/1994 | Tran et al. | 427/555 |
| 5,308,439 | 5/1994 | Cronin et al. | 156/656 |
| 5,312,514 | 5/1994 | Kumar | 156/643 |
| 5,312,777 | 5/1994 | Cronin et al. | 437/195 |
| 5,315,393 | 5/1994 | Mican | 348/268 |
| 5,329,207 | 7/1994 | Cathey et al. | 315/169.1 |
| 5,330,879 | 7/1994 | Dennison | 430/313 |
| 5,341,063 | 8/1994 | Kumar | 313/309 |
| 5,347,201 | 9/1994 | Liang et al. | 315/366 |
| 5,347,292 | 9/1994 | Ge et al. | 345/74 |
| 5,357,172 | 8/1994 | Lee et al. | 315/167 |
| 5,368,681 | 11/1994 | Hiraoka et al. | 427/585 |
| 5,378,963 | 1/1995 | Ikeda | 313/495 |
| 5,380,546 | 1/1995 | Kirshnan et al. | 427/126.1 |
| 5,387,844 | 2/1995 | Browning | 315/169.3 |
| 5,393,647 | 2/1995 | Neukermans et al. | 430/320 |
| 5,396,150 | 3/1995 | Wu et al. | 313/495 |
| 5,399,238 | 3/1995 | Kumar | 156/643 |
| 5,401,676 | 3/1995 | Lee | 437/200 |
| 5,402,041 | 3/1995 | Kishino et al. | 315/169.1 |
| 5,404,070 | 4/1995 | Tsai et al. | 313/336 |
| 5,408,161 | 4/1995 | Kishino et al. | 313/495 |
| 5,410,218 | 4/1995 | Hush | 315/169.1 |
| 5,412,285 | 5/1995 | Komatsu | 315/169.1 |

OTHER PUBLICATIONS

"Recent Progress in Low–Voltage Field–Emission Cathode Development," *Journal de Physique*, Colloque C9, supp. au No. 12, Tome 45, Dec. 12984, pp. 269–278.

"The influence of surface treatment on field emission from silicon microemitter," *J. Phys.: Condens. Matter*, vol. 3, 1991, pp. S231–S236.

"Topography: Texturing Effects," *Handbook of Ion Beam Processing Technology*, Chapter 17, pp. 338–361.

"Ultrasharp tips for field emission applications prepared by the vapor–liquid–solid growth technique," *J. Vac. Sci. Technol. B*, vol. 11, No. 2, Mar./Apr. 1993, pp. 449–453.

"A Comparative Study of Deposition of Thin Films by Laser Induced PVD with Femtosecond and Nanosecond Laser Pulses," *SPIE*, vol. 1858, 1993, pp. 464–475.

"Amorphic diamond films produced by a laser plasma source," *J. Appl. Physics*, vol. 67, No. 4, Feb. 15, 1990, pp. 2081–2087.

"Characterization of laser vaporization plasmas generated for the deposition of diamond–like carbon," *J. Appl. Phys.*, vol. 72, No. 9, Nov. 1, 1992, pp. 3966–3970.

"Cold Field Emission From CVD Diamond Films Observed in Emission Electron Microscopy," Dept. of Physics & Astronomy & the Condensed Matter & Surface Science Program, Ohio University, Athens, Ohio, Jun. 10, 1991.

"Current Display Research—A Survey," Zenith Radio Corporation.

"Deposition of Amorphous Carbon Films from Laser–Produced Plasmas," *Mat. Res. Soc. Sump. Proc.*, vol. 38, 1985, pp. 326–335.

"Development of Nano–Crystaline Diamond–Based Field–Emission Displays," *SID 94Digest*, 1994, pp. 43–45.

"Diamond Cold Cathode," *IEEE Electron Device Letters*, vol. 12, No. 8, Aug. 1991, pp. 456–459.

"Diamond–like carbon films prepared with a laser ion source," *Appl. Phys. Lett.*, vol. 53, No. 3, 18 Jul. 1988, pp. 187–188.

"Direct Observations of Laser–Induced Crystallization of a–C:H Films," *Appl. Phys. A*, vol. 58, 1994, pp. 137–144.

"Emission spectroscopy during excimer laser ablation of graphite," *Appl. Phys. Letters*, vol. 57, No. 21, 19 Nov. 1990, pp. 2178–2180.

"Enhanced cold–cathode emission using composite resin–carbon coatings," Dept. of Electronic Eng. & Applied Physics, Astron Univ., Aston Triangle, Birmingham, UK, 29 May 1987.

"High Temperature Chemistry in Laser Plumes," *John L. Margrave Research Symposium*, Rice University, Apr. 29, 1994.

"Imaging and Characterization of Plasma Plumes Produced During Laser Ablation of Zirconium Carbide," *Mat. Res. Soc. Symp. Proc.*, vol. 285, pp. 81–86 (Laser Ablation in Materials Processing: Fundamentals and Applications—symposium held Dec. 1–4, 1992, Boston, Mass.).

"Laser–Assisted Selective Area Metallization of Diamond Surface by Electroless Nickel Plating," *2nd International Conference on the Applications of Diamond Films and Related Materials*, 1993, pp. 303-306.
"Laser plasma source of amorphic diamond," *Appl. Phys. Lett.*, vol. 54, No. 3, Jan. 16, 1989, pp. 216–218.
"Optical characterization of thin film laser deposition processes," *SPIE*, vol. 1594, Process Module Metrology, Control, and Clustering, 1991, pp. 411–417.
"Optical Emission Diagnostics of Laser–Induced Plasma for Diamond–like Film Deposition," *Appl. Phys. A*, vol. 52, 1991, pp. 328–334.
"Optical observation of plumes formed at laser ablation of carbon materials," *Applied Surface Science*, vol. 79/80, 1994, pp. 141–145.
"Spatial characteristics of laser pulsed plasma deposition of thin films," *SPIE*, vol. 1352, Laser Surface Microprocessing, 1989, pp. 95–99.
"Species Temporal and Spatial Distributions in Laser Ablation Plumes," *Mat. Res. Soc. Symp. Proc.*, vol. 285, pp. 39–44 (Laser Ablation in Materials Processing: Fundamentals and Applications—symposium held Dec. 1–4, 1992, Boston, Mass.).
"The bonding of protective films of amorphic diamond to titanium," *J. Appl. Phys.*, vol. 71, No. 7, 1 Apr. 1992, pp. 3260–3265.
"Thermochemistry of materials by laser vaporization mass spectrometry: 2. Graphite," *High Temperatures—High Pressures*, vol. 20, 1988, pp. 73–89.
"A Comparison of the Transmission Coefficient and the Wigner Function Approaches to Field Emission," *COMPEL*, vol. 11, No. 4, 1992, pp. 457–470.
"A New Model for the Replacement Process in Electron Emission at High Fields and Temperatures," Dept. of Physics, The Penn. State Univ., University Park, PA.
"Angle–resolved photoemission of diamond (111) and (100) surfaces; negative electron affinity and band structure measurements," *J. Vac. Sci. Technol. B*, vol. 12, No. 4, Jul./Aug. 1994, pp. 2475–2479.
"Angular Characteristics of the Radiation by Ultra Relativistic Electrons in Thick Diamond Single Crystals," *Sov. Tech. Phys. Lett.*, vol. 11, No. 11, Nov. 1985, pp. 574–575.
"Argon and hydrogen plasma interactions on diamond (111) surfaces: Electronic states and structure," *Appl. Phys. Lett.*, vol. 62, No. 16, 19 Apr. 1993, pp. 1878–1880.
"A Theoretical Study on Field Emission Array for Microsensors," *IEEE Transactions on Electron Devices*, vol. 39, No. 2, Feb. 1992, pp. 313–324.
"A Wide–Bandwidth High–Gain Small–Size Distributed Amplifier with Field–Emission Triodes (Fetrode's) for the 10 to 300 GHz Frequency Range," *IEEE Transactions on Electron Devices*, vol. 36, No. 11, Nov. 1989, pp. 2728–2737.
"Capacitance–Voltage Measurements on Metal-$SiO_2$–Diamond Structures Fabricated with (100)– and (111)–Oriented Substrates," *IEEE Transactions on Electron Devices*, vol. 38, No. 3, Mar. 1991, pp. 619–626."Characterisation of the Field Emitting Properties of CVD Diamond Films, " *Conference Record—1994 Tri–Service/NASA Cathode Workshop*, Cleveland, Ohio, March 29-31, 1994, pp. 91–94.
"Collector–Assisted Operation of Micromachined Field–Emitter Triodes ," *IEEE Transactions on Electron Devices*, vol. 40, No. 8, Aug. 1993, pp. 1537–1542.
"Collector–Induced Field Emmission Triode," *IEEE Transactions on Electron Devices*, vol. 39, No. 11, Nov. 1992, pp. 2616–2620.
"Diamond–based field emission flat panel displays," *Solid State Technology*, May 1995, pp. 71–74.
"Diamond Cold Cathodes: Applications of Diamond Films and Related Materials," Elsevier Science Publishers BN, 1991, pp. 309–310 [copy to be provided].
"Diamond Field-Emission Cathodes," *Conference Record—1994 Tri –Service/NASA Cathode Workshop*, Cleveland, Ohio, Mar. 29–31, 1994.
"Diamond Field–Emission Cathode Technology," Lincoln Laboratory @ MIT.
"Diamond–like nanocomposites (DLN)," *Thin Solid Films*, vol. 212, 1992, pp. 267–273.
"Diamond–like nanocomposites: electronic transport mechanisms and some applications," *Thin Solid Films*, vol. 212, 1992, pp. 274–281.
"Electrical characterization of gridded field emission arrays," *Inst. Phys. Conf. Ser. No. 99: Section 4* Presented at 2nd Int. Conf. on Vac. Microelectron, Bath, pp. 81–84.
"Electrical phenomena occurring at the surface of electrically stressed metal cathodes. I. Electroluminescence and breakdown phenomena with medium gap spacings (2–8 mm)," *J. Phys. D: Appl. Phys.*, vol. 12, 1979, pp. 2229–2245.
"Electrical phenomena ocurring at the surface of electrically stressed metal cathodes. II. Identification of electroluminescent (k–spot) radiation with electron emission on broad area cathodes," *J. Phys. D: Appl. Phys.*, vol. 12, 1979, pp. 2247–2252.
"Electroluminescence produced by high electric fields at the surface of copper cathodes," *J. Phys. D: Appl. Phys.*, vol. 10, 1977, pp. L195–L201.
"Electron emission from phosphorus– and boron–doped polycrystalline Diamond films," *Electronics Letters*, vol. 31, No. 1, Jan. 1995, pp. 74–75.
"Electron Field Emission from Amorphic Diamond Thin Films," *6th International Vacuum Microelectronics Conference Technical Digest*, 1993, pp. 162–163.
"Electron Field Emission from Broad–Area Electrodes," *Appl. Phys. A*, vol. 28, 1982, pp. 1–24.
"Emission characteristics of metal–oxide–semiconductor electron tunneling cathode," *J. Vac. Sci. Technol. B*, vol. 11, No. 2, Mar./Apr. 1993, pp. 429–432.
"Emission Characteristics of Silicon Vacuum Triodes with Four Different Gate Geometries," *IEEE Transactions on Electron Devices*, vol. 40, No. 8, Aug. 1993, pp. 1530–1536.
"Emission Properties of Spindt–Type Cold Cathodes with Different Emission Cone Material", *IEEE Transactions on Electron Devices*, vol. 38, No. 10, Oct. 1991.
"Energy exchange processes in field emission from atomically sharp metallic emitters," *J. Vac. Sci. Technol. B*, vol. 11, No. 2, Mar./Apr. 1993, pp. 366–370.
"Experimental and theoretical determinations of gate–to–emitter stray capacitances of field emitters," *J. Vac. Sci. Technol. B*, vol. 11, No. 2, Mar./Apr. 1993, pp. 445-448.
"Fabrication and Characterization of Lateral Field–Emitter Triodes, " *IEEE Transactions on Electron Devices*, vol. 38, No. 10, Oct. 1991, pp. 2334–2336.
"Field–Dependence of the Area–Density of 'Cold' Electron Emission Sites on Broad–Area CVD Diamond Films," *Electronics Letters*, vol. 29, No. 18, 2 Sep. 1993, pp. 1596–1597.
"Field Electron Energy Distributions for Atomically Sharp Emitters," The Penn. State univ., University Park, PA.

*Field Emission and Field Ionization*, "Theory of Field Emission" (Chapter 1) and "Field-Emission Microscopy and Related Topics" (Chapter 2), Harvard Monographs in Applied Science, No. 9, Harvard University Press, Cambridge, Mass., 1961, pp. 1-63.

"Field Emission Cathode Technology and It's [sic] Applications, " *Technical Digest of IVMC 91*, Nagahama, 1991, pp. 40-43.

"Field Emission Characteristics Requirements for Field Emission Displays, " Conf. of 1994 Int. Display Research Conf. and Int. Workshops on Active -Matrix Mat'ls, Oct. 1994.

"Field emission device modeling for application to flat displays," *J. Vac. Sci. Technol. B*, vol. 11, No. 2, Mar./Apr. 1993, pp. 518-522.

"Field Emission Displays Based on Diamond Thin Films," *Society of Information Display Conference Technical Digest*, 1993, pp. 1009-1010.

"Field emission from silicon through an adsorbate layer," *J. Phys. : Condens. Matter*, vol. 3, 1991, pp. S187-S192.

"Field Emission from Tungsten-Clad Silicon Pyramids," *IEEE Transactions on Electron Devices*, vol. 36, No. 11, Nov. 1989, pp. 2679 - 2685.

"Field Emission Measurements with μm Resolution on CVD-Polycrystalline Diamond Films," To be published and presented at the 8th IVMC '95, Portland, Oregon.

"Field-emitter-array development for high-frequency operation, " *J. Vac. Sci. Technol. B*, vol. 11, No. 2, Mar./Apr. 1993, pp. 468 -473.

"Field Emitter Arrays Applied to Vacuum Fluorescent Displays," *Journal de Physique*, Colloque C6, supp. au No. 11, Tome 49, Nov. 1988, pp. 153-154.

"Field Emitter Arrays—More Than a Scientific Curiosity?" *Colloque de Physique*, Colloque c8, supp. au No. 11, Tome 50, Nov. 1989, pp. 67-72.

"Field Emitter Array with Lateral Wedges," *Technical Digest of IVMC 91*, Nagahama, 1991, pp. 50-51.

"Field emitter tips for vacuum microelectronic devices," *J. Vac. Sci. Technol. A*, vol. 8, No. 4, Jul./Aug. 1990, pp. 3586-3590.

"Field-induced electron emission through Langmuir-Blodgett multiplayers,"Dept. of Electrical and Electronic Engineering and Applied Physics, Aston Univ., Birmingham, UK, Sep. 1987 (0022-3727/88/010148+06).

"Field-Induced Photoelectron Emission from p-Type Silicon Aluminum Surface-Barrier Diodes," *J. Appl. Phys.*, vol. 41, No. 5, Apr. 1970, pp. 1945-1951.

"Flat-Panel Displays,"*Scientific American*, Mar. 1993, pp. 90 -97.

"Gated Field Emitter Failures: Experiment and Theory," *IEEE Transactions on Plasma Science*, vol. 20, No. 5, Oct. 1992, pp. 499-506.

"High-resolution simulation of field emission," *Nuclear Instruments and Methods in Physics Research* A298, 1990, pp. 39-44.

"Ion-space-charge initiation of gated field emitter failure," *J. Vac. Sci. Technol. B*, vol. 11, No. 2, Mar./Apr. 1993, pp. 441-444 .

"Low-energy transmission and secondary-electron experiments on crystalline and molten long-chain alkanes," *Physical Review B*, vol. 34, No. 9, 1 Nov. 1986, pp. 6386-6393.

"Low Energy Electron Transmission Measurements on Polydiacetylene Langmuir-Blodgett Films," *Thin Solid Films*, vol. 179, 1989, pp. 327-334.

"Measurement of gated field emitter failures, *Rev. Sci. Instrum.*, vol. 64, No. 2, Feb. 1993, pp. 581-582.

"Metal-Film-Edge Field Emitter Array with a Self-Aligned Gate," *Technical Digest of IVMC 91*, Nagahama, 1991, pp. 46-47.

"Microstructural Gated Field Emission Sources for Electron Beam Applications," *SPIE*, vol. 1671, 1992, pp. 201-207.

"Microstructure of Amorphic Diamond Films," The Univ. of Texas at Dallas, Center for Quantum Electronics, Richardson, Texas.

"Microtip Field-Emission Display Performance Considerations," *SID 92 Digest*, pp. 523-526.

"Monoenergetic and Directed Electron Emission from a Large-Bandgap Organic Insulator with Negative Electron Affinity," *Europhysics Letters*, vol. 5, No. 4, 1988, pp. 375-380.

"Monte Carlo Simulation of Ballistic Charge Transport in Diamond under an Internal Electric Field," Dept. of Physics, The Penn. State Univ., University Park, PA, Mar. 3, 1995.

"Negative Electron Affinity and Low Work Function Surface: Cesium on Oxygenated Diamond (100)," *Physical Review Letters*, vol. 73, No. 12, 19 Sep. 1994, pp. 1664-1667.

"Numerical simulation of field emission from silicon," *J. Vac. Sci. Technol. B*, vol. 11, No. 2, Mar./Apr. 1993, pp. 371-378.

"Optical Recording in Diamond-Like Carbon Films," *JJAP Series 6, Proc. Int. Symp. on Optical Memory*, 1991, pp. 116-120.

"Optimization of Amorphic Diamond™ for Diode Field Emission Displays ," Microelectronics and Computer Technology Corporation and SI Diamond Technology, Inc.

"Planer [sic] Field Emission Devices with Three-Dimensional Gate Structures," *Technical Digest of IVMC 91*, Nagahama 1991, pp. 78- 79.

"Real-time, in situ photoelectron emission microscopy observation of CVD diamond Oxidation and dissolution on molybdenum," *Diamond and Related Materials*, vol. 3, 1994, pp. 1066-1071.

"Recent Development on 'Microtips' Display at LETI," *Technical Digest of IVMC 91*, Nagahama, 1991, pp. 6-9.

"Schottky barrier height and negative electron affinity of titanium on (111) diamond,"*J. Vac. Sci. Technol. B*, vol. 10, No. 4, Jul./Aug. 1992, pp. 1940-1943.

"Sealed Vacuum Devices: Microchips Fluorescent Display," 3rd International Vacuum Microelectronics Conference, Monterrey, U.S.A., Jul. 1990 [copy to be provided].

"Silicon Field Emitter Arrays for Cathodoluminescent Flat Panel Displays, " CH-3071-8/91/0000-0141, 1991 IEEE.

"Simulation of Field Emission from Silicon: Self-Consistent Corrections Using the Wigner Distribution Function," *COMPEL*, vol. 12, No. 4, 1993, 507-515.

"Single micromachined emitter characteristics," *J. Vac. Sci. Technol. B*, vol. 11, No. 2, Mar./Apr. 1993, pp. 369-399.

"Stability of the emission of a microtip," *J. Vac. Sci. Technol. B*, vol. 12, No. 2, Mar./Apr. 1994, pp. 685-688.

"Structure and Electrical Characteristics of Silicon Field--Emission Microelectronic Devices," *IEEE Transactions on Electron Devices*, vol. 38, No. 10, Oct. 1991, pp. 2309-2313.

"Substrate and Target Voltage Effects on Sputtered Hydrogenated Amorphous Silicon," *Solar Energy Materials*, vol. 11, 1985, pp. 447-454.

"Synchrotron radiation photoelectron emission microscopy of chemical-vapor-deposited diamond electron emitters," *J. Vac. Sci. Technol. A*, vol. 13, No. 3, May/Jun. 1995, pp. 1-5.
"Temperature dependence of I-V characteristics of vacuum triodes from 24 to 300 K,"*J. Vac. Sci. Technol. B*, vol. 11, No. 2, Mar./Apr. 1993 , pp. 400-402.
"The Field Emission Display: A New Flat Panel Technology," CH-3071-9/91/0000-0012 501.00 © 1991 IEEE.
"The nature of field emission sites," *J. Phys. D: Appl. Phys.*, vol. 8, 1975, pp. 2065-2073.
"Theoretical Study of field emission from diamond," *Appl. Phys. Lett.*, vol. 65, No. 20, 14 Nov. 1994, pp. 2562-2564.
"Theory of electron emission in high fields from atomically sharp emitters: Validity of the Fowler-Nordheim equation," *J. Vac. Sci. Technol. B*, vol. 11, No. 2, Mar./Apr. 1993, pp. 387-391.
"The Semiconductor Field-Emission Photocathode," *IEEE Transactions on Electron Devices*, vol. ED-21, No. 12, Dec. 1974, pp. 785-797.
"The SIDT/MCC Amorphic Diamond Cathode Field Emission Display Technology, " David Sarnoff Research Center—Client Study, Mar. 1994.
"The source of high-β electron emission sites on broad-area high-voltage alloy electrodes," *j. Phys. D: Appl. Phys.*, vol. 12, 1979, pp. 969-977.
"Thin-Film Diamond," *The Texas Journal of Sciences*, vol. 41, No. 4, 1989, pp. 343-358.
"Thin Film Emitter Development," *Technical Digest of IVMC 91*, Nagahama, 1991, pp. 118-119.
"Triode characteristics and vacuum considerations of evaporated silicon microdevices," *J. Vac. Sci. Technol. B*, vol. 11, No. 2, Mar./Apr. 1993, pp. 422-425. "Tunnelling theory and vacuum microelectronics," *Inst. Phys. Conf. Ser. No. 99: Section 5*, Presented at 2nd Int. Conf. on Vac. Microelectron, Bath, 1989, pp. 121-131.
"Ultrahigh-vacuum field emitter array wafer tester," *Rev. Sci. Instrum.*, vol. 58, No. 2, Feb. 1987, pp. 301-304.
"Use of Diamond Thin Films for Low Cost Field Displays," *6th International Vacuum Microelectronics Conference Technical Digest*, 1994, pp. 229-232.
"Vacuum microtriode characteristics," *J. Vac. Sci. Technol. A*, vol. 8, No. 4, Jul./Aug. 1990, pp. 3581-3585.
"Wedge-Shaped Field Emitter Arrays for Flat Display," *IEEE Transactions on Electron Devices*, vol. 38, No. 10, Oct. 1991, pp. 2395-2397.
*Cathodoluminescence: Theory and Application*, Chapter 9 and 10, VCH Publishers, New York, NY, 1990.
"Cathodoluminescent Materials," *Electron Tube Design*, D. Sarnoff Res. Center Yearly Reports & Review, 1976, pp. 128-137.
"Electron Microscopy of Nucleation and Growth of Indium and Tin Films," *Philosophical Magazine*, vol. 26, No. 3, 1972, pp. 649-663.
"Improved Performance of Low Voltage Phosphors for Field Emission Displays ,"SID Display Manufacturing Conf., Santa Clara, CA, Feb. 2, 1995.
"Phosphor Materials for Cathode-Ray Tubes," *Advances in Electronics and Electron Physics*, vol. 17, 1990, pp. 271-351.
"Phosphors and Screens," *Advances in Electronics and Electron Physics*, vol. 67, Academic Press, Inc., 1986, pp. 254, 272-273.
"The Chemistry of Artificial Lighting Devices—Lamps, Phosphors and Cathode Ray Tubes," *Studies in Inorganic Chemistry 17*, Elsevier Science Publishers B.V., The Netherlands, 1993, pp. 573-593.
Data Sheet on Anode Drive SN755769, Texas Instruments, pp. 4-81 to 4-88 .
Data Sheet on Display Driver, HV38, Supertex, Inc., pp. 11-43 to 11-50.
Data Sheet on Voltage Driver, HV620, Supertex Inc., pp. 1-6, May 21, 1993.
Data Sheet on Voltage Drive, HV 622, Supertex Inc., pp. 1-5, Sep. 22, 1992 .
"Light scattering from aggregated silver and gold films," *J. Opt. Soc. Am.*, vol. 64, No. 9, Sep. 1974, pp. 1190-1193.

METHODS FOR FABRICATING FLAT PANEL DISPLAY SYSTEMS AND COMPONENTS

This is a division of application Ser. No. 08/147,700 filed Nov. 4, 1993, now abandoned.

TECHNICAL FIELD OF THE INVENTION

The present invention relates in general to flat panel displays and in particular to methods for fabricating flat panel display systems and components.

CROSS-REFERENCE TO RELATED APPLICATIONS

The following copending and coassigned United States patent applications contain related material and are incorporated herein by reference:

U.S. patent application Ser. No. 07/851,701, Attorney Docket Number M0050-P01US, entitled "Flat Panel Display Based On Diamond Thin Films," and filed Mar. 16, 1992; and U.S. patent application Ser. No. 08/071,157, Attorney Docket Number M0050-P03US, entitled "Amorphic Diamond Film Flat Field Emission Cathode," and filed Jun. 2, 1993.

BACKGROUND OF THE INVENTION

Field emitters are useful in various applications such as flat panel displays and vacuum microelectronics. Field emission based displays in particular have substantial advantages over other available flat panel displays, including lower power consumption, higher intensity, and generally lower cost. Currently available field emission based flat panel displays however disadvantageously rely on micro-fabricated metal tips which are difficult to fabricate. The complexity of the metal tip fabrication processes, and the resulting low yield, lead to increased costs which disadvantageously impact on overall display system costs.

Field emission is a phenomenon which occurs when an electric field proximate the surface of an emission material narrows a width of a potential barrier existing at the surface of the emission material. This narrowing of the potential barrier allows a quantum tunnelling effect to occur, whereby electrons cross through the potential barrier and are emitted from the material. The quantum mechanical phenomenon of field emission is distinguished from the classical phenomenon of thermionic emission in which thermal energy within an emission material is sufficient to eject electrons from the material.

The field strength required to initiate field emission of electrons from the surface of a particular material depends upon that material's effective "work function." Many materials have a positive work function and thus require a relatively intense electric field to bring about field emission. Other materials such as cesium, tantalum nitride and trichromium monosilicide, can have low work functions, and do not require intense fields for emission to occur. An extreme case of such a material is one with negative electron affinity, whereby the effective work function is very close to zero (<0.8 eV). It is this second group of materials which may be deposited as a thin film onto a conductor, to form a cathode with a relatively low threshold voltage to induce electron emissions.

In prior art devices, the field emission of electrons was enhanced by providing a cathode geometry which increases local electric field at a single, relatively sharp point at the tip of a cone (e.g., a micro-tip cathode). For example, U.S. Pat. No. 4,857,799, which issued on Aug. 15, 1989, to Spindt et al., is directed to a matrix-addressed flat panel display using field emission cathodes. The cathodes are incorporated into the display backing structure, and energize corresponding cathodoluminescent areas on an opposing face plate. Spindt et al. employ a plurality of micro-tip field emission cathodes in a matrix arrangement, the tips of the cathodes aligned with apertures in an extraction grid over the cathodes. With the addition of an anode over the extraction grid, the display described in Spindt et al. is a triode (three terminal) display.

Micro-tip cathodes are difficult to manufacture since the micro-tips have fine geometries. Unless the micro-tips have a consistent geometry throughout the display, variations in emission from tip to tip will occur, resulting in uneven illumination of the display. Furthermore, since manufacturing tolerances are relatively tight, such micro-tip displays are expensive to make. Thus, to this point in time, substantial efforts have been made in an attempt to design cathodes which can be mass produced with consistent close tolerances.

In addition to the efforts to solve the problems associated with manufacturing tolerances, efforts have been made to select and use emission materials with relatively low effective work functions in order to minimize extraction field strength. One such effort is documented in U.S. Pat. No. 3,947,716, which issued on Mar. 30, 1976, to Fraser, Jr. et al., directed to a field emission tip on which a metal adsorbent has been selectively deposited. Further, the coated tip is selectively faceted with the emitting planar surface having a reduced work function and the non-emitting planar surface as having an increased work function. While micro-tips fabricated in this manner have improved emission characteristics, they are expensive to manufacture due to the required fine geometries. The need for fine geometries also makes emission consistency between micro-tips difficult to maintain. Such disadvantages become intolerable when large arrays of micro-tips, such as in flat display applications, are required.

Additional efforts have been directed to finding suitable geometries for cathodes employing negative electron affinity substances as a coating for the cathode. For instance, U.S. Pat. No. 3,970,887, which issued on Jul. 20, 1976, to Smith et al., is directed to a microminiature field emission electron source and method of manufacturing the same. In this case, a plurality of single crystal semiconductor raised field emitter tips are formed at desired field emission cathode sites, integral with a single crystal semiconductor substrate. The field emission source according to Smith et al. requires the sharply tipped cathodes found in Fraser, Jr. et al. and is therefore also subject to the disadvantages discussed above.

U.S. Pat. No. 4,307,507, issued Dec. 29, 1981 to Gray et al. and U.S. Pat. No. 4,685,996 to Busta et al. describe methods of fabricating field emitter structures. Gray et al. in particular is directed to a method of manufacturing a field-emitter array cathode structure in which a substrate of single crystal material is selectively masked such that the unmasked areas define islands on the underlying substrate. The single crystal material under the unmasked areas is orientation-dependent etched to form an array of holes whose sides intersect at a crystallographically sharp point. Busta et al. is also directed to a method of making a field emitter which includes anisotropically etching a single crystal silicon substrate to form at least one funnel-shaped protrusion on the substrate. Busta et al. further provides for the fabrication of a sharp-tipped cathode.

Sharp-tipped cathodes are further described in U.S. Pat. No. 4,885,636, which issued on Aug. 8, 1989, to Busta et al. and U.S. Pat. No. 4,964,946, which issued on Oct. 23, 1990, to Gray et al. Gray et al. in particular discloses a process for fabricating soft-aligned field emitter arrays using a soft-leveling planarization technique, (e.g., a spin-on process).

While the use of low effective work-function materials improves emission, the sharp tipped cathodes referenced above are still subject to the disadvantages inherent with the required fine geometries: sharp-tipped cathodes are expensive t0 manufacture and are difficult to fabricate such that consistent emission is achieved across an array. Flat cathodes help minimize these disadvantages. Flat cathodes are much less expensive and less difficult to produce in large numbers (such as in an array) because the microtip geometry is eliminated. In Ser. No. 07/851,701, which was filed on Mar. 16, 1992, and entitled "Flat Panel Display Based on Diamond Thin Films," an alternative cathode structure was first disclosed. Ser. No. 07/851,701 discloses a cathode having a relatively flat emission surface as opposed to the aforementioned micro-tip configuration. The cathode, in its preferred embodiment, employs a field emission material having a relatively low effective work function. The material is deposited over a conductive layer and forms a plurality of emission sites, each of which can field-emit electrons in the presence of a relatively low intensity electric field.

A relatively recent development in the field of materials science has been the discovery of amorphic diamond. The structure and characteristics of amorphic diamond are discussed at length in "Thin-Film Diamond," published in the Texas Journal of Science, vol. 41, no. 4, 1989, by C. Collins et al. Collins et al. describe a method of producing amorphic diamond film by a laser deposition technique. As described therein, amorphic diamond comprises a plurality of micro-crystallites, each of which has a particular structure dependent upon the method of preparation of the film. The manner in which these micro-crystallites are formed and their particular properties are not entirely understood.

Diamond has a negative election affinity. That is, only a relatively low electric field is required to narrow the potential barrier present at the surface of diamond. Thus, diamond is a very desirable material for use in conjunction with field emission cathodes. For example, in "Enhanced Cold-Cathode Emission Using Composite Resin-Carbon Coatings," published by S. Bajic and R. V. Latham from the Department of Electronic Engineering and Applied Physics, Aston University, Aston Triangle, Burmingham B4 7ET, United Kingdom, received May 29, 1987, a new type of composite resin-carbon field-emitting cathode is described which is found to switch on at applied fields as low as approximately 1.5 MV $m^{-1}$, and subsequently has a reversible I-V characteristic with stable emission currents of greater than or equal to 1 mA at moderate applied fields of typically greater than or equal to 8 MV $m^{-1}$. A direct electron emission imaging technique has shown that the total externally recorded current stems from a high density of individual emission sites randomly distributed over the cathode surface. The observed characteristics have been qualitatively explained by a new hot-electron emission mechanism involving a two-stage switch-on process associated with a metal-insulator-metal-insulator-vacuum (MIMIV) emitting regime. However, the mixing of the graphite powder into a resin compound results in larger grains, which results in fewer emission sites since the number of particles per unit area is small. It is preferred that a larger amount of sites be produced to produce a more uniform brightness from a low voltage source.

Similarly, in "Cold Field Emission From CVD Diamond Films Observed In Emission Electron Microscopy," published by C. Wang, A. Garcia, D. C. Ingram, M. Lake and M. E. Kordesch from the Department of Physics and Astronomy and the Condensed Matter and Surface Science Program at Ohio University, Athens, Ohio on Jun. 10, 1991, there is described thick chemical vapor deposited "CVD" polycrystalline diamond films having been observed to emit electrons with an intensity sufficient to form an image in the accelerating field of an emission microscope without external excitation. The individual crystallites are of the order of 1–10 microns. The CVD process requires 800° C. for the depositing of the diamond film. Such a temperature would melt a glass substrate used in flat panel displays.

In sum the prior art has failed to: (1) take advantage of the unique properties of amorphic diamond; (2) provide for field emission cathodes having a more diffused area from which field emission can occur; and (3) provide for a high enough concentration of emission sites (i.e., smaller particles or crystallites) to produce a more uniform electron emission from each cathode site, yet require a low voltage source in order to produce the required field for the electron emissions.

SUMMARY OF THE INVENTION

According to one embodiment of the present invention, a method is provided for fabricating a display cathode which includes the steps of forming a conductive line adjacent a face of a substrate and forming a region of amorphic diamond adjacent a selected portion of the conductive line.

According to another embodiment of the present invention, a method is provided for fabricating a cathode plate for use in a diode display unit which includes the step of forming a first layer of conductive material adjacent a face of a substrate. The first layer of conductive material is patterned and etched to define a plurality of cathode stripes spaced by regions of the substrate. A second layer of conductive material is formed adjacent the cathode stripes and the spacing regions of the substrate. Next, a mask is formed adjacent the second layer of conductive material, the mask including a plurality of apertures defining locations for the formation of a plurality of spacers. The spacers are then formed by introducing a selected material into the apertures. Portions of the second layer of conductive material are selectively removed to expose areas of surfaces of the cathode stripes. Finally, a plurality of amorphic diamond emitter regions are formed in selected portions of the surfaces of the cathode stripes.

According to an additional embodiment of the present invention, a method is provided for fabricating a pixel of a triode display cathode which includes the steps of forming a conductive stripe at a face of a substrate. A layer of insulator is formed adjacent the conductive stripe. A layer of conductor is next formed adjacent the insulator layer and patterned and etched along with the layer of conductor to form a plurality of apertures exposing portions of the conductive stripe. An etch is performed through the apertures to undercut portions of the layer of insulator forming a portion of a sidewall of each of the apertures. Finally, regions of amorphic diamond are formed at the exposed portions of the conductive stripe.

According to a further embodiment of the present invention a method is provided for fabricating a triode display cathode plate which includes the step of forming a plurality of spaced apart conductive stripes at a face of a substrate. A layer of insulator is formed adjacent the conductive stripes followed by the formation of a layer of conductor adjacent the insulator layer. The layer of insulator and the layer of conductor are patterned and etched to form a plurality of apertures exposing portions of the conductive stripes. An etch is performed through the apertures to undercut portions of the layer of insulator forming a portion of a sidewall of each of the apertures. Finally, regions of amorphic diamond are formed at the exposed portions of the conductive stripes.

The embodiments of the present invention have substantial advantages over prior art flat panel display components. The embodiments of the present invention advantageously take advantage of the unique properties of amorphic diamond. Further, the embodiments of the present invention provide for field emission cathodes having a more diffused area from which field emission can occur. Additionally, the embodiments of the present invention provide for a high enough concentration of emission sites that advantageously produces a more uniform electron emission from each cathode site, yet which require a low voltage source in order to produce the required field for the electron emissions.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1A:
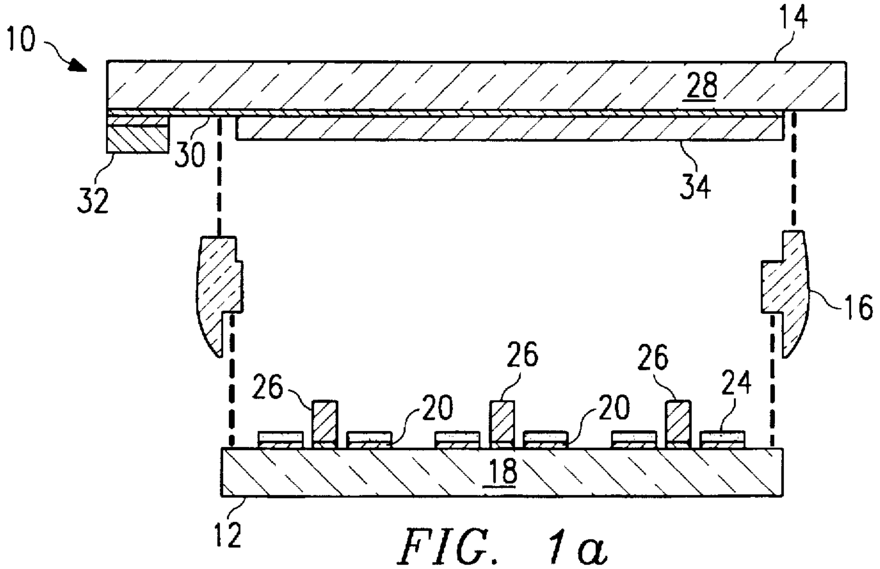
FIG. 1*a* is an enlarged exploded cross-sectional view of a field emission (diode) display unit constructed according to the principles of the present invention.
Figure 1B:
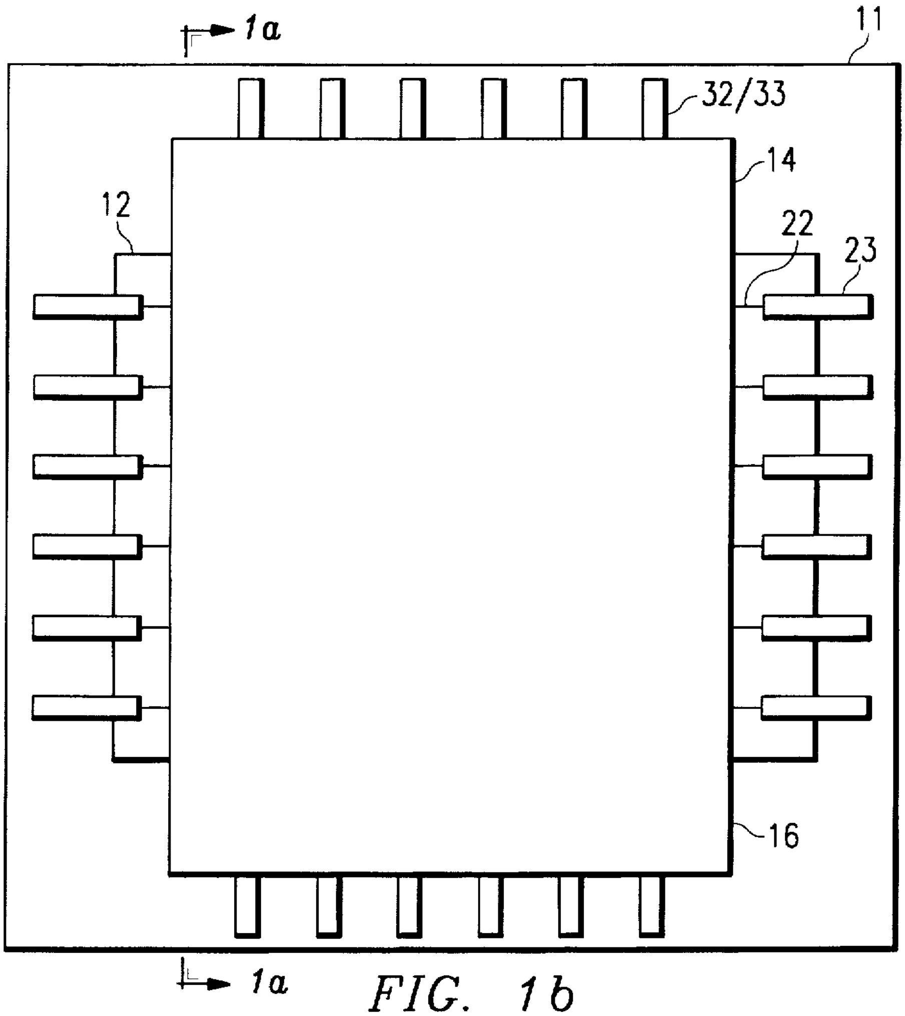
FIG. 1*b* is a top plan view of the display unit shown in FIG. 1*a* as mounted on a supporting structure.
Figure 1C:
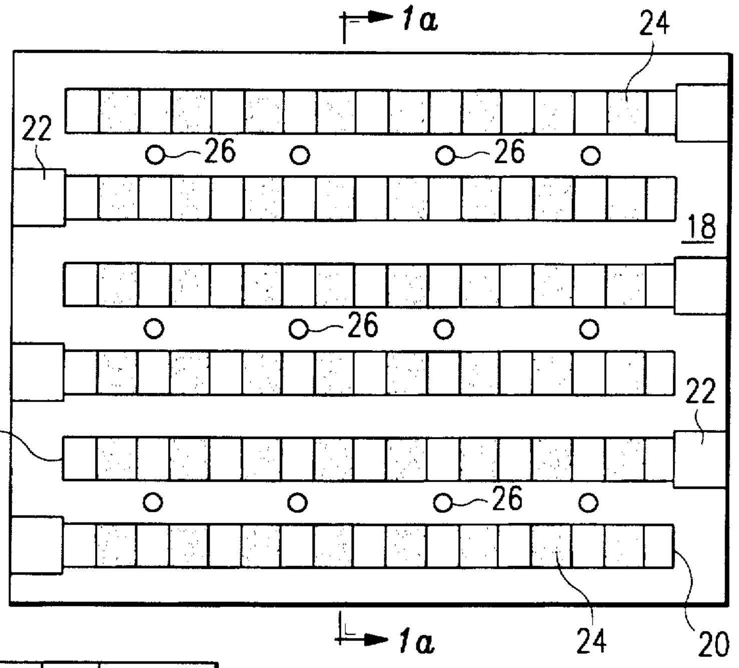
FIG. 1*c* is a plan view of the face of the cathode plate shown in FIG. 1*a;*

The preferred embodiments of present invention are best understood by referencing FIGS. 1–5 of the drawings in which like numerals designate like parts. FIG. 1*a* is an enlarged exploded cross-sectional view of a field emission (diode) display unit 10 constructed in accordance with the principles of the present invention. A corresponding top plan view of display unit 10 mounted on a supporting structure (printed circuit board) 11 is provided in FIG. 1*b*. Display unit 10 includes a sandwich of two primary components: a cathode plate 12 and an anode plate 14. A vacuum is maintained between cathode plate 12 and anode plate 14 by a seal 16. Separate plan views of the opposing faces of cathode plate 12 and anode plate 14 are provided in FIGS. 1*c* and 1*d* respectively (the view of FIG. 1*a* substantially corresponds to line 1*a*—1*a* of FIGS. 1*b*, 1*c*and 1*d*).

Cathode plate 12, the fabrication of which is discussed in detail below, includes a glass (or other light transmitting material) substrate or plate 18 upon which are disposed a plurality of spaced apart conductive lines (stripes) 20. Each conductive line 20 includes an enlarged lead or pad 22 allowing connection of a given line 20 to external signal source (not shown) (in FIG. 1*b* display unit pads 22 are shown coupled to the wider printed circuit board leads 23). Disposed along each line 20 are a plurality of low effective work-function emitters areas 24, spaced apart by a preselected distance. In the illustrated embodiment, low effective work-function emitter areas are formed by respective layers of amorphic diamond. A plurality of regularly spaced apart pillars 26 are provided across cathode plate 12, which in the complete assembly of display 10 provide the requisite separation between cathode plate 12 and anode plate 14.

Anode plate 14, the fabrication of which is also discussed in detail below, similarly includes a glass substrate or plate 28 upon which are disposed a plurality of spaced apart transparent conductive lines (stripes) 30, e.g., ITO (Indium doped Tin Oxide). Each conductive line 30 is associated with a enlarge pad or lead 32, allowing connection to an external signal source (not shown) (in FIG. 1*b* display unit pads 32 are shown coupled to the wider printed circuit board leads 33). A layer 34 of a phosphor or other photo-emitting material is formed along the substantial length of each conductive line 30.

In display unit 10, cathode plate 12 and anode plate 14 are disposed such that lines 20 and 30 are substantially orthogonal to each other. Each emitter area 24 is proximately disposed at the intersection of the corresponding line 20 on cathode plate 12 and line 30 on anode plate 14. An emission from a selected emitter area 24 is induced by the creation of a voltage potential between the corresponding cathode line 20 and anode line 30. The electrons emitted from the selected emitter area 24 strike the phosphor layer 34 on the corresponding anode line 30 thereby producing light which is visible through anode glass layer 28. For a more complete description of the operation of display 10, reference is now made to copending and coassigned U.S. patent application Ser. No. 08/071,157, Attorney's Docket Number M0050-P03US.

Figure 2A:
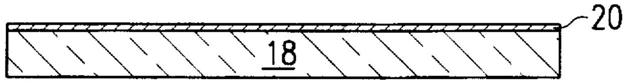
FIGS. 2*a*–2*l* are a series of enlarged cross-sectional views of a workpiece sequentially depicting the fabrication of the cathode plate of FIG. 1*a;*

The fabrication of diode display cathode plate 12 according the principles of the present invention can now be described by reference to illustrated embodiment of FIGS. 2*a*–2*l*. In FIG. 2*a*, a layer 20 of conductive material has been formed across a selected face of glass plate 18. In the illustrated embodiment, glass plate 18 comprises a 1.1 mm thick soda lime glass plate which has been chemically cleaned by a conventional process prior to the formation of conductive layer 20.

Conductive layer 20 in the illustrated embodiment comprises a 1400 angstroms thick layer of chromium. It should be noted that alternate materials and processes may be used for the formation of conductive layer 20. For example, conductive layer 20 may alternatively be a layer of copper, aluminum, molybdenum, tantalum, titanium, or a combination thereof. As an alternative to sputtering, evaporation or laser ablation techniques may be used to form conductive layer 20.

Figure 2B:
Figure 2C:
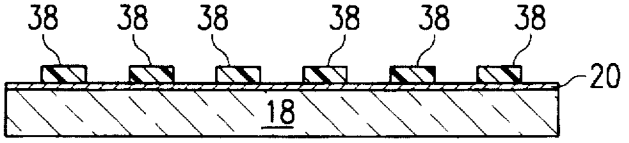
Figure 2D:
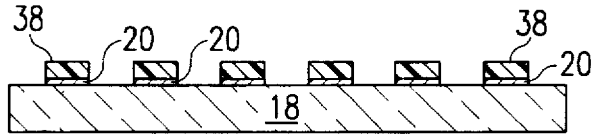
Figure 2E:
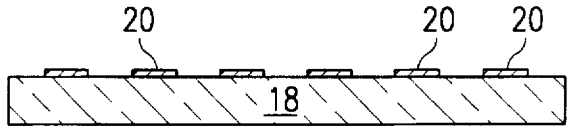

Referring next to FIG. 2*b*, a layer of photoresist 38 has been spun across the face of conductive layer 20. The photoresist may be for example, a 1.5 mm layer of Shipley 1813 photoresist. Next, as is depicted in FIG. 2*c*, photoresist 38 has been exposed and developed to form a mask defining the boundaries and locations of cathode lines 20. Then, in FIG. 2*d*, following a descum step (which may be accomplished for example using dry etch techniques), conductive layer 20 is etched, the remaining portions of layer 20 becoming the desired lines 20. In the preferred embodiment, the etch step depicted in FIG. 2*d* is a wet etch 38. In FIG. 2*e*, the remaining portions of photoresist 36 are stripped away, using for example, a suitable wet etching technique.

Figure 2F:
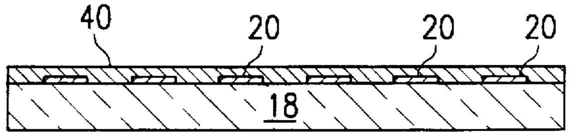
Figure 2G:
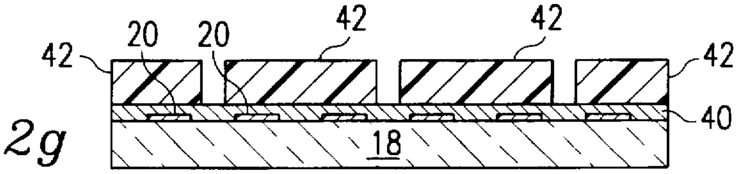

In FIG. 2*f* a second layer of conductor 40 has been formed across the face of the workpiece. In the illustrated embodiment conductive layer 40 is formed by successively sputtering a 500 angstroms layer of titanium, a 2500 angstroms layer of copper, and a second 500 angstroms layer of titanium. In alternate embodiments, metals such as chromium—copper—titanium may be used as well as layer formation techniques such as evaporation. Next, as shown in FIG. 2*g*, a layer 42 of photoresist is spun across the face of conductive layer 40, exposed, and developed to form a mask defining the boundaries and locations of pillars (spacers) 26 and pads (leads) 22. Photoresist 42 may be for example a 13 μm thick layer of AZP 4620 photoresist.

Figure 2H:
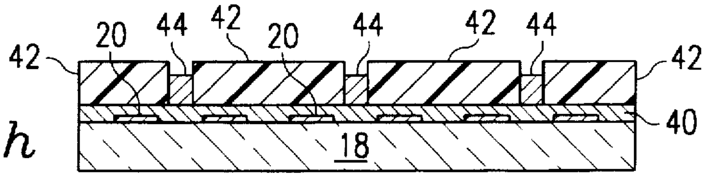
Figure 2I:
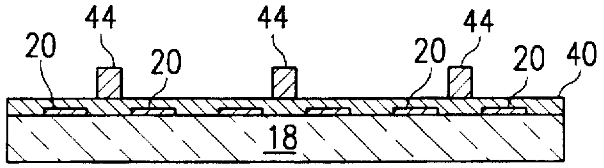
Figure 2J:
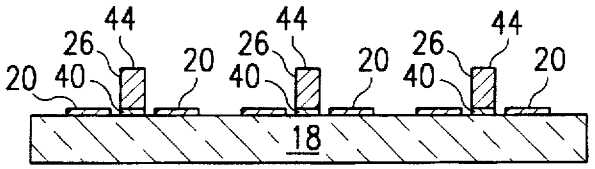

Following descum (which again may be performed using dry etch techniques), as shown in FIG. 2*h*, regions 44 are formed in the openings in photoresist 42. In the illustrated embodiment regions 44 are formed by the electrolytic plating of 25 μm of copper or nickel after etching away titanium in the opening. Following the plating step, photoresist 42 is stripped away, using for example WAYCOAT 2001 at a temperature of 80° C., as shown in FIG. 2*i*. Conductor layer 40 is then selectively etched as shown in FIG. 2*j*. In the illustrated embodiment, a non-HF wet etch is used to remove the copper/titanium layer 40 to leave pillars 26 and pads 22 which comprise a stack of copper layer 44 over a titanium/copper/titanium layer 40.

Figure 2K:
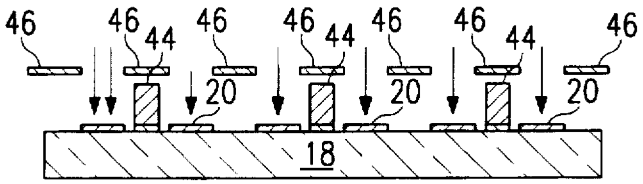
Figure 2L:
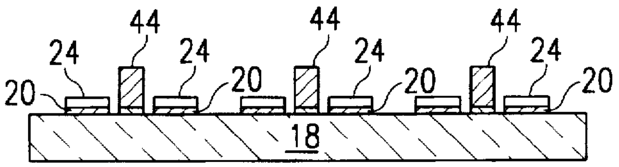

In FIG. 2*k*, a metal mask 46 made form copper, molybdenum or preferably magnetic materials such as nickel or Kovar defining the boundaries of emitter areas 24 is placed on top of the cathode plate and is aligned properly to the spacers and lines. Emitter areas 24 are then fabricated in the areas exposed through the mask by the formation of amorphic diamond films comprising a plurality of diamond micro-crystallites in an overall amorphic structure. In the embodiment illustrated in FIG. 2*k*, the amorphic diamond is formed through the openings in metal mask 46 using laser ablation. The present invention however is not limited to the technique of laser ablation. For example, emitter areas 24 having micro-crystallites in an overall amorphic structure may be formed using laser plasma deposition, chemical vapor deposition, ion beam deposition, sputtering, low temperature deposition (less than 500° C.), evaporation, cathodic arc evaporation, magnetically separated cathodic arc evaporation, laser acoustic wave deposition, similar techniques, or a combination thereof. One such process is described in "Laser Plasma Source of Amorphic Diamond," published by American Institute of Physics, January 1989, by Collins et. al.

In general the micro-crystallites form with certain atomic structures which depend on environmental conditions during layer formation and somewhat by chance. At a given environmental pressure and temperature, a certain percentage of crystals will emerge in an SP2 (two-dimensional bonding of carbon atoms) while a somewhat smaller percentage will emerge in an SP3 configuration (three-dimensional bonding of carbon atoms). The electron affinity for diamond micro-crystallites in the SP3 configuration is less than that of the micro-crystallites in the SP2 configuration. Those micro-crystallites in the SP3 configuration therefore become the "emission sites" in emission areas 24. For a full appreciation of the advantages of amorphic diamond, reference is now made to copending and coassigned U.S. patent application Ser. No. 08/071,157, Attorney's Docket Number M0050-P03US.

Finally, in FIG. 21, ion beam milling, or a similar technique, is used to remove leakage paths between paths between lines 20. In addition other conventional cleaning methods (commonly used in microfabrication technology) may be used to remove large carbon (or graphite) particles generated during amorphic diamond deposition. Following conventional clean-up and trimming away of the excess glass plate 18 around the boundaries, cathode plate 12 is ready for assembly with anode plate 14.

Figure 3A:
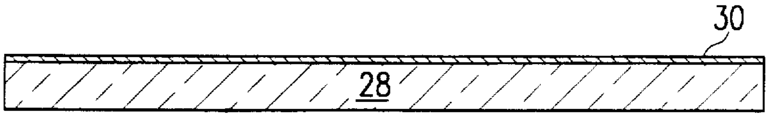
FIGS. 3*a*–3*k* are a series of enlarged cross-sectional views of a workpiece sequentially depicting the fabrication of the anode plate of FIG. 1*a;*

The fabrication of the anode plate 14 according to the principles of the present invention can now be described using the illustrative embodiment of FIGS. 3*a*–3*k*. In FIG. 3*a*, a layer 30 of conductive material has been formed across a selected face of glass plate 28. In the illustrated embodiment, glass plate 28 comprises a 1.1 mm thick layer of soda lime glass which has been previously chemically cleaned by a conventional process. Transparent conductive layer 30 in the illustrated embodiment comprises a 2000 A thick layer of Indium doped Tin Oxide formed by sputtering.

Figure 3B:
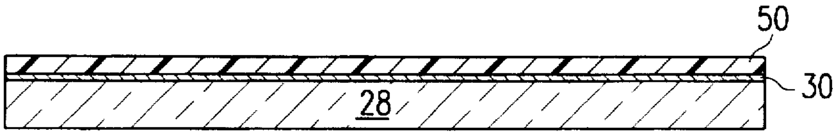
Figure 3C:
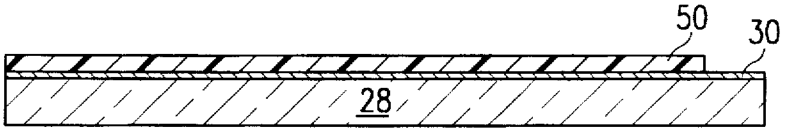
Figure 3D:
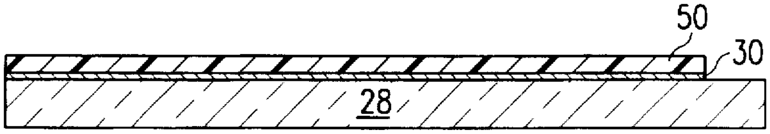
Figure 3E:
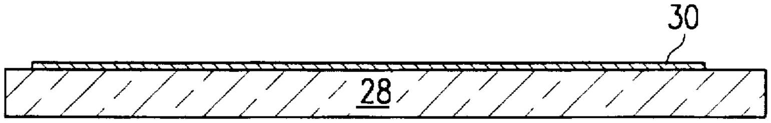

Referring next to FIG. 3*b*, a layer of photoresist 50 has been spun across the face of conductive layer 30. The photoresist may be for example a 1.5 μm layer of Shipley 1813 photoresist. Next, as is depicted in FIG. 3*c*, photoresist 50 has been exposed and developed to form a mask defining the boundaries and locations of anode lines 30. Then, in FIG. 3*d* following a conventional descum step, conductive layer 30 is etched, the remaining portions of layer 30 becoming the desired lines 30. In FIG. 3*e*, the remaining portions of photoresist 50 are stripped away.

Figure 3F:
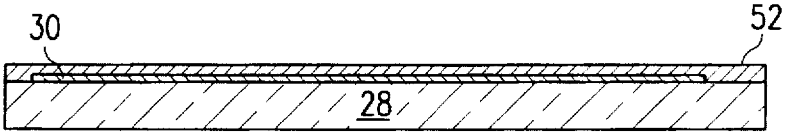
Figure 3G:
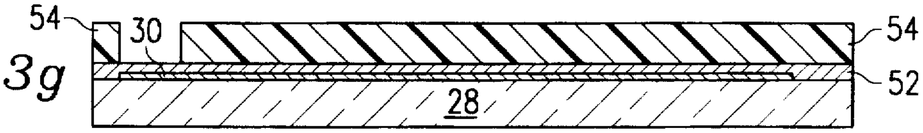

In FIG. 3*f* a second layer of conductor 52 has been formed across the face of the workpiece. In the illustrated embodiment conductive layer 52 is formed by successively sputtering a 500 A layer of titanium, a 2500 A layer of copper, and a second 500 A layer of titanium. In alternate embodiments, other metals and fabrication processes may be used at this step, as previously discussed in regards to the analogous step shown in FIG. 2*f*. Next, as depicted in FIG. 3*g*, a layer 54 of photoresist is spun across the face of conductive layer 52, exposed, and developed to form a mask defining the boundaries and locations of pads (leads) 32.

Figure 3H:
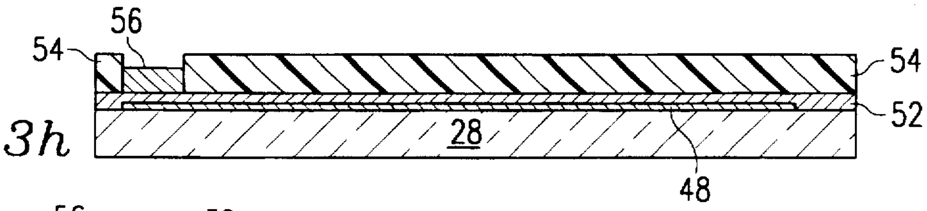
Figure 3I:
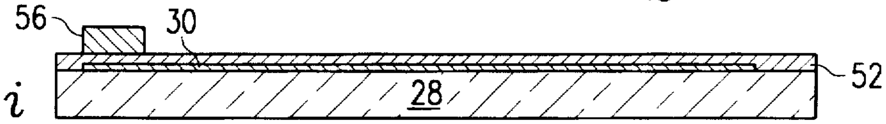
Figure 3J:
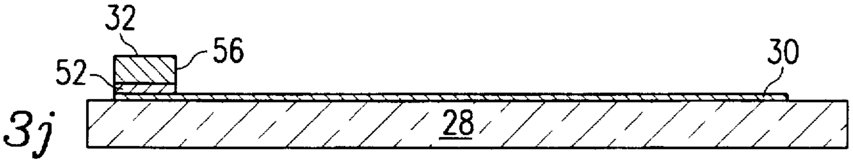

Following descum, pads (leads) 32 are completed by forming plugs of conductive material 56 in the openings in photoresist 54 as depicted in FIG. 3*h*. In the illustrated embodiment, pads 32 are formed by the electrolytic plating of 10 μm of copper. Following the plating step, photoresist 54 is stripped away, using for example WAYCOAT 2001 at a temperature of 80° C., as shown in FIG. 3*i*. The exposed portions of conductor layer 52 are then etched as shown in FIG. 2*j*. In FIG. 3*j*, a non-HF wet etch is used to remove exposed portions of titanium/copper/titanium layer 52 to leave pads 32 which comprise a stack of corresponding portions of conductive stripes 30, the remaining portions of titanium/copper/titanium layer 52 and the conductive plugs 56. The use of a non-HF etchant avoids possible damage to underlying glass 28.

Figure 3K:
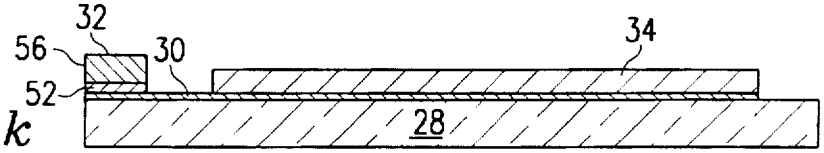

After cleaning and removing excess glass 28 around the boundaries, phosphor layer 34 is selectively formed across substantial portions of lines anode lines 30 as shown in FIG. 3*k*. Phosphor layer, in the illustrated embodiment a layer of powdered zinc oxide (ZnO), may be formed for example using a conventional electroplating method such as electrophoresis.

Figure 1D:
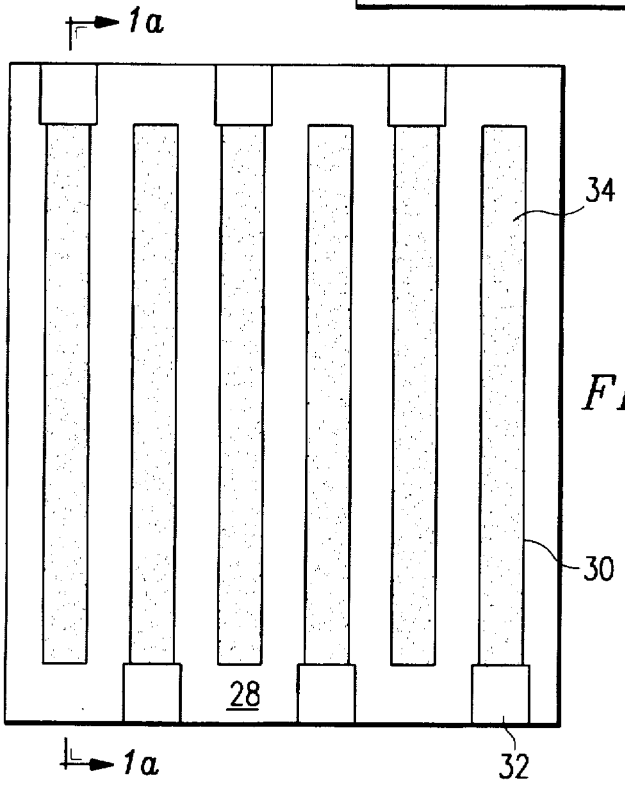
FIG. 1*d* is a plan view of the face of the anode plate shown in FIG. 1*a;*

Display unit 10 depicted in FIGS. 1*a* and 1*d* can then be assembled from a cathode plate 12 and anode plate 14 as described above. As shown, the respective plates are disposed face to face and sealed in a vacuum of $10^{-7}$ torr using seal which extends along the complete perimeter of unit 10. In the illustrated embodiment, seal 16 comprises a glass frit seal, however, in alternate embodiments, seal 16 may be fabricated using laser sealing or by an epoxy, such as TORR-SEAL (Trademark) epoxy.

Figure 4A:
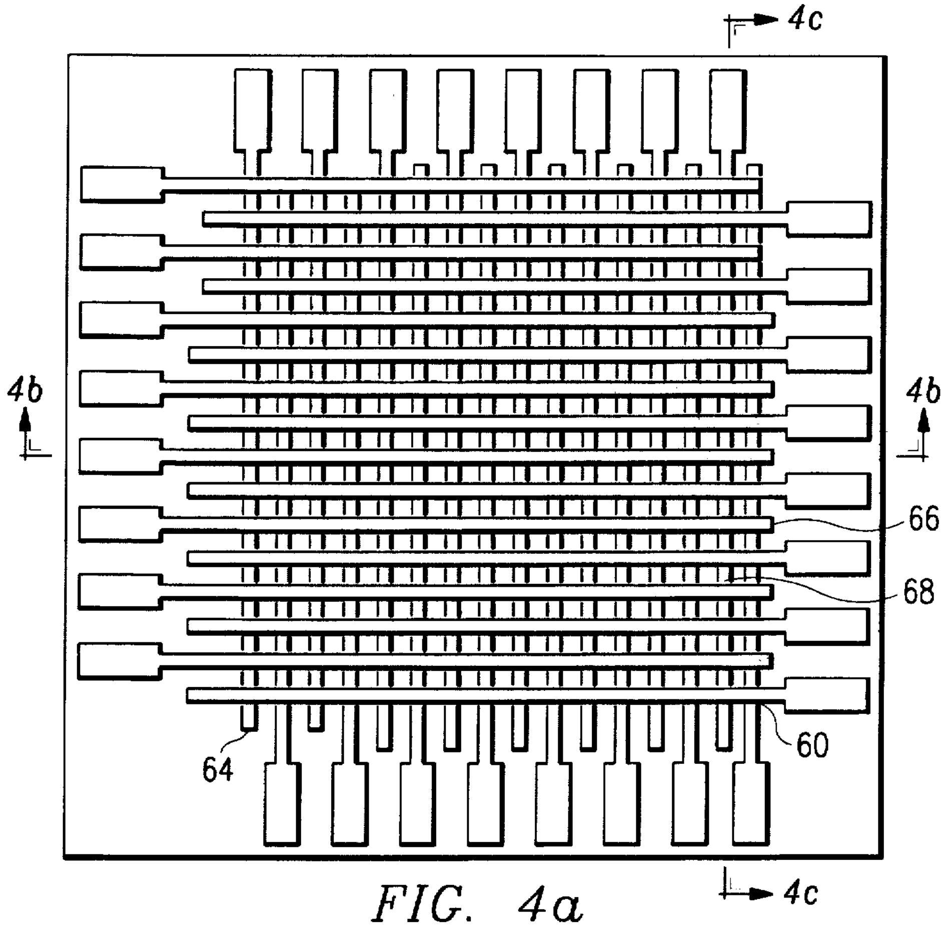
FIG. 4*a* is an enlarged plan view of a cathode/extraction grid for use in a field emission (triode) display unit constructed in accordance with the principles of the present invention.
Figure 4B:
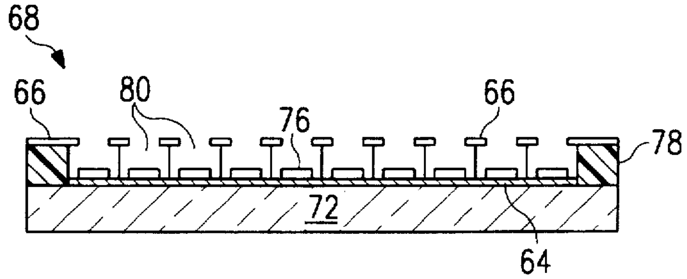
FIG. 4*b* is a magnified cross-sectional view of a selected pixel in the cathode/extraction grid of FIG. 4*a;*
Figure 4C:
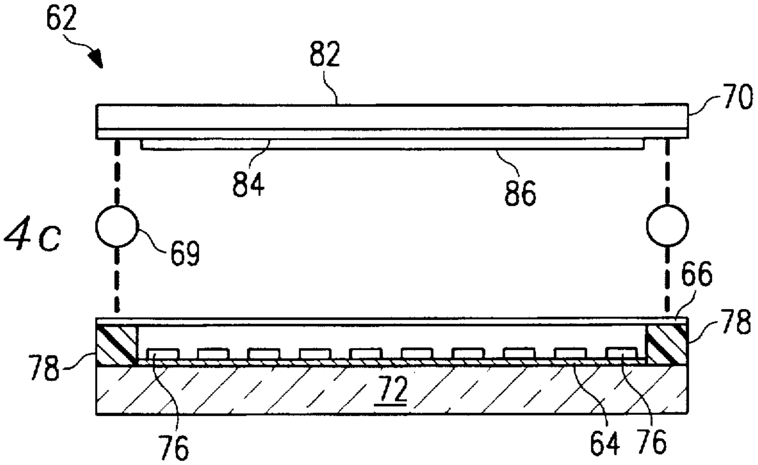
FIG. 4*c* is an enlarged exploded cross-sectional view of a field emission (triode) display unit embodying the cathode/extraction grid of FIG. 4*a;*

Reference is now made to FIG. 4*a*, which depicts the cathode/grid assembly 60 of a triode display unit 62 (FIG. 4*c*). Cathode/grid assembly 60 includes a plurality of parallel cathode lines (stripes) 64 and a plurality of overlying extraction grid lines or stripes 66. At each intersection of a given cathode stripe 64 and extraction line 66 is disposed a "pixel" 68. A further magnified cross-sectional view of a typical "pixel" 68 is given in FIG. 4*b* as taken substantially along line 4*b*—4*b* of FIG. 4*a*. A further magnified exploded cross-sectional view of the selected pixel 68 in the context of a triode display unit 62, with the corresponding anode plate 70 in place and taken substantially along line 4*c*—4*c* of FIG. 4*a* is given in FIG. 4*c*. Spacers 69 separate anode plate 70 and cathode/grid assembly 60.

The cathode/grid assembly 60 is formed across the face of a glass layer or substrate 72. At a given pixel 68, a plurality of low work function emitter regions 76 are disposed adjacent the corresponding conductive cathode line 64. Spacers 78 separate the cathode lines 64 from the intersecting extraction grid lines 66. At each pixel 68, a plurality of apertures 80 are disposed through the grid line 66 and aligned with the emitter regions 76 on the corresponding cathode line 64.

The anode plate 70 includes a glass substrate 82 over which are disposed a plurality of parallel transparent anode stripes or lines 84. A layer of phosphor 86 is disposed on the exposed surface of each anode line, at least in the area of each pixel 68. For monochrome display, only an unpatterned phosphor such as ZnO is required. However, if a color display is required, each region on anode plate 70 corresponding to a pixel will have three different color phosphors. Fabrication of anode plate 70 is substantially the same as described above with the exception that the conductive anode lines 84 are patterned and etched to be disposed substantially parallel to cathode lines 64 in the assembled triode display unit 62.

Figure 5A:
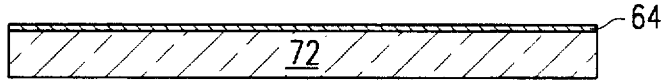
FIGS. 5*a*–5*k* are a series of enlarged cross-sectional views of a workpiece sequentially depicting the fabrication of the cathode/extraction grid of FIG. 4*a;*

The fabrication of a cathode/grid assembly 60 according to the principles of the present invention can now be described by reference to the embodiment illustrated in FIGS. 5*a*–5*k*. In FIG. 5*a*, a layer 64 of conductive material has been formed across a selected face of glass plate 72. In the illustrated embodiment, glass plate 72 comprises a 1.1 mm thick soda lime glass which has been chemically cleaned by a conventional process prior to formation of conductive layer 64. Conductive layer 64 in the illustrated embodiment comprises a 1400 angstroms thick layer of chromium. It should be noted that alternate materials and fabrication processes can be used to form conductive layer, as discussed above in regards to conductive layer 20 of FIG. 2*a* and conductive layer 30 of FIG. 3*a*.

Figure 5B:
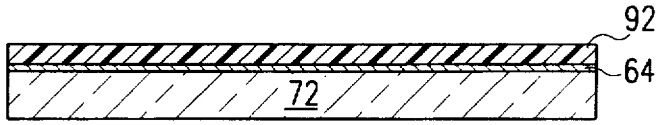
Figure 5C:
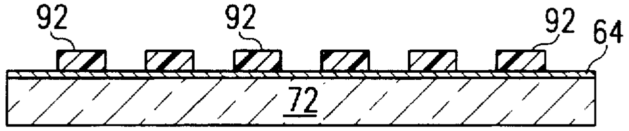
Figure 5D:
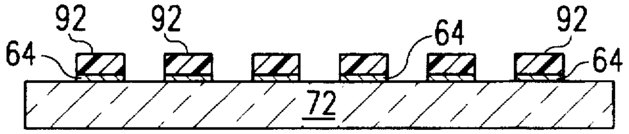
Figure 5E:
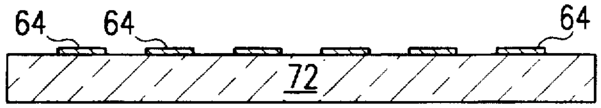

Referring next to FIG. 5*b*, a layer of photoresist 92 has been spun across the face of conductive layer 64. The photoresist may be for example a 1.5 μm layer of Shipley 1813 photoresist. Next, as is depicted in FIG. 5*c*, photoresist 92 has been exposed and developed to form a mask defining the boundaries and locations of cathode lines 64. Then, in FIG. 5*d* following a conventional descum (for example, performed by a dry etch process), conductive layer 64 is etched leaving the desired lines 64. In FIG. 5*e*, the remaining portions of photoresist 92 are stripped away.

Figure 5F:
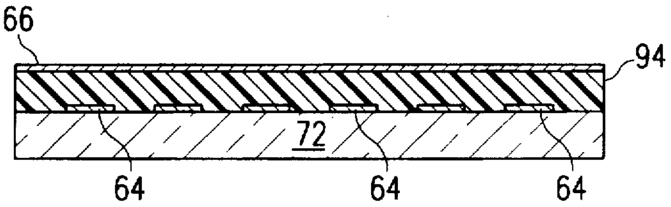

Next, as shown in FIG. 5*f*, a insulator layer 94 is formed across the face of the workpiece. In the illustrated embodiment, insulator layer 94 comprises a 2 μm thick layer of silicon dioxide (SiO2) which is sputtered across the face of the workpiece. A metal layer 66 is then formed across insulator layer 94. In the illustrated embodiment, metal layer comprises a 5000 A thick layer of titanium-tungsten (Ti-W) (90%–10%) formed across the workpiece by sputtering. In alternate embodiments, other metals and fabrications may be used.

Figure 5G:
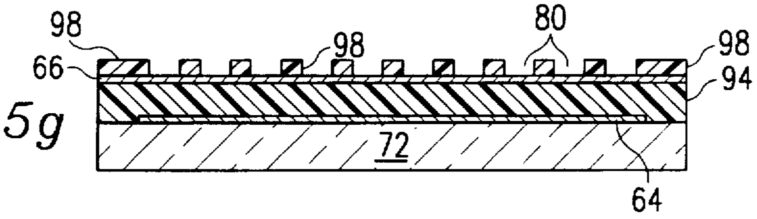
Figure 5H:
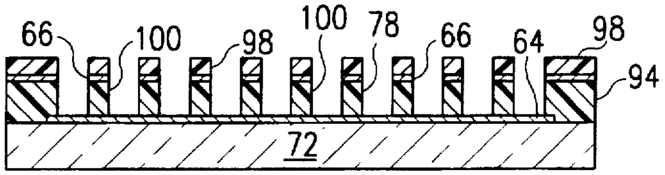
Figure 5I:
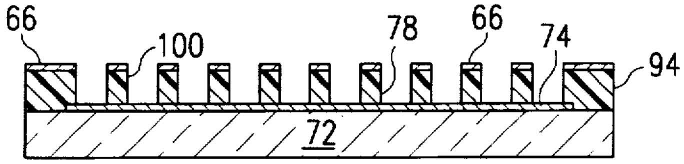

FIG. 5*g* is a further magnified cross-sectional view of a portion of FIG. 5*f* focusing on a single pixel 68. In FIG. 5*g*, a layer 98 of photoresist, which may for example be a 1.5 μm thick layer of Shipley 1813 resist, is spun on metal layer 96. Photoresist 98 is then exposed and developed to define the location and boundaries of extraction grid lines 66 and the apertures 80 therethrough. Following descum, metal layer 66 (TI-W in the illustrated embodiment) and insulator layer 94 (in the illustrated embodiment $SiO_2$) are etched as shown in FIG. 5*h* leaving spacers 78. Preferably, a reactive ion etch process is used for this etch step to insure that the sidewalls 100 are substantially vertical. In FIG. 5*i*, the remaining portions of photoresist layer 98 is removed, using for example WAYCOAT 2001 at a temperature of 80° C.

Figure 5J:
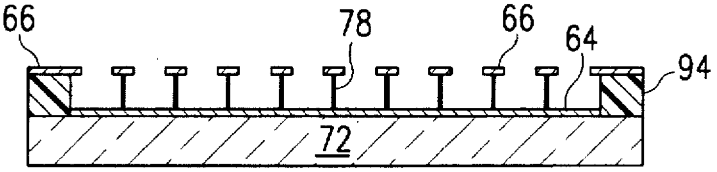
Figure 5K:
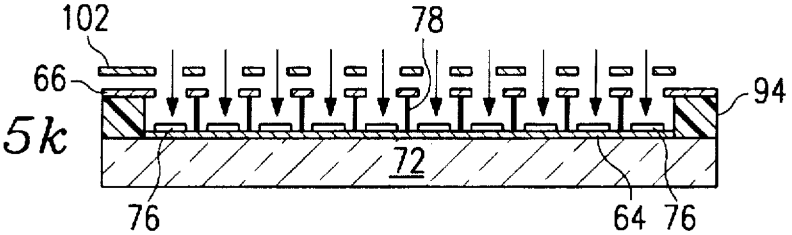

After photoresist removal, a wet etch is performed which undercuts insulator layer 94, as shown in FIG. 5*j* further defining spacers 78. In other words, the sidewalls of the wet etch may be accomplished for example using a buffer-HF solution. The cathode/grid structure 62 is essentially completed with the formation of the emitter areas 76. In FIG. 5*k*, a metal mask 102 is formed defining the boundaries and locations of emitter areas 76. Emitter areas 76 are then fabricated by the formation of amorphic diamond films comprising a plurality of diamond micro-crystallites in an overall amorphic structure. In the embodiment illustrated in FIG. 5j, the amorphic diamond is formed through the openings in metal mask 102 using laser ablation. Again, the present invention however is not limited to the technique of laser ablation. For example, emitter areas 76 having micro-crystallites in an overall amorphic structure may be formed using laser plasma deposition, chemical vapor deposition, ion beam deposition, sputtering, low temperature deposition (less than 500° C.), evaporation, cathodic arc evaporation, magnetically separated cathodic arc evaporation, laser acoustic wave deposition, similar techniques, or a combination thereof. The advantages of such amorphic diamond emitter areas 76 have been previously described during the above discussion of diode display unit 10 and in the cross-references incorporated herein.

Figure 6:
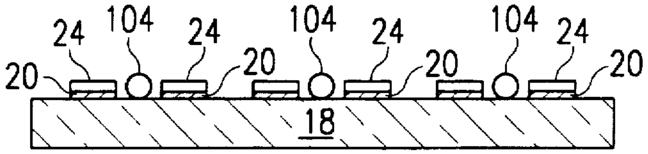
FIG. 6 depicts an alternate embodiment of the cathode plate shown in FIG. 1*a* in which the microfabricated spacers have been replaced by glass beads.

FIG. 6 shows an alternative embodiment of cathode plate 12. In this case, the fabrication of spacers 44 shown in steps 2f–2j is not required. Thereafter, small glass, sapphire, polymer or metal beads or fibers, such as the depicted 25 micron diameter glass beads 104, are used as spacers, as seen in FIG. 6. Glass beads 104 may be attached to the substrate by laser welding, evaporated indium or glue. Alternatively, glass beads 104 may be held in place by subsequent assembly of the anode and cathode plates.

Figure 7:
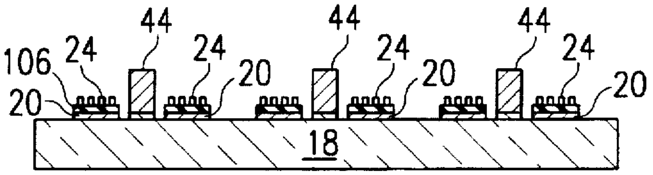
FIG. 7 depicts an additional embodiment of the cathode plate shown in FIG. 1*a* in which layers of high resistivity material has been fabricated between the metal cathode lines and the amorphic diamond films.

FIG. 7 shows a further embodiment of cathode plate 12. In this case, a thin layer 106 of a high resistivity material such as amorphous silicon has been deposited between the metal line 20 and the amorphic diamond film regions 24. Layer 106 helps in the self-current limiting of individual emission sites in a given pixel and enhances pixel uniformity. Also as shown in FIG. 7, each diamond layer 24 is broken into smaller portions. The embodiment as shown in FIG. 7 can be fabricated for example by depositing the high resistivity material through metal mask 46 during the fabrication step shown in FIG. 2k (prior to formation of amorphic diamond regions 24) using laser ablation, e-beam deposition or thermal evaporation. The amorphic diamond is then deposited on top of the high resistivity layer 106. In order to create layers 24 which are broken into smaller regions as shown in FIG. 7, the amorphic diamond film can be directed through a wire mesh (not shown) intervening between metal mask 46 and the surface of layer 106. In a preferred embodiment, the wire mesh has apertures therethrough on the order of 20–40 μm, although larger or smaller apertures can be used depending on the desired pixel size.

Figure 8A:
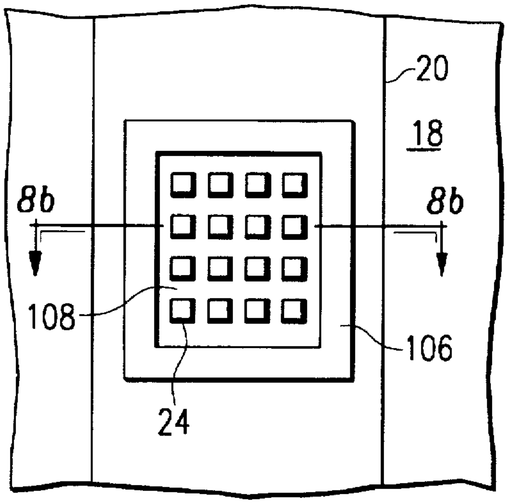
FIGS. 8*a* and 8*b* depict a further embodiment using both the high resistivity material shown in FIG. 7 and patterned metal cathode lines.
Figure 8B:
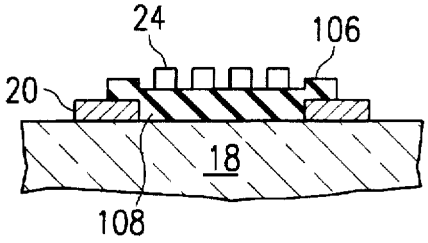

In FIGS. 8a and 8b an additional embodiment of cathode plate 12 having patterned metal lines 20 is depicted. In this case, an aperture 108 has been opened through the metal line 20 and a high resistivity layer 106 such as that discussed above formed therethrough. The amorphic diamond thin films 24 are then disposed adjacent the high resistivity material 106. In the embodiment shown in FIGS. 8a and 8b, diamond amorphic films 24 have been patterned as described above.

It should be noted that in any of the embodiments disclosed herein, the amorphic diamond films may be fabricated using random morphology. Several fabrication methods such as ion beam etching, sputtering, anodization, sputter deposition and ion-assisted implantation which produce very fine random features of sub-micron size without the use of photolithography. One such method is described in co-pending and co-assigned patent application Ser. No. 08/052,958 entitled "Method of Making A Field Emitter Device Using Randomly Located Nuclei As An Etch Mask", Attorney's Docket No. DMS-43/A, a combination of random features which enhance the local electric field on the cathode and low effective work function produces even lower electron extraction fields.

It should be recognized that the principles of the embodiments shown in FIGS. 6–8 for cathode plate 12 can also be applied to the fabrication of cathode/grid assembly 60 of triode display unit 62 (FIG. 4c).

It should also be noted that while the spacers herein have been illustrated as disposed on the cathode plate, the spacers may also be disposed on the anode plate, or disposed and aligned on the cathode and anode plates in accordance with the present invention.

Although the present invention and its advantages have been described in detail, it should be understood that various changes, substitutions and alterations can be made herein without departing from the spirit and scope of the invention as defined by the appended claims.

What is claimed is:

1. A method of fabricating a pixel of a triode pixel display cathode comprising the steps of:

forming a conductive stripe on a face of a substrate;

forming a layer of insulator on the conductive stripe;

forming a layer of conductor on the insulator layer;

patterning and etching the layer of insulator and the layer of conductor to form a plurality of apertures exposing portions of the conductive stripe;

etching through the apertures to undercut portions of the layer of insulator forming a portion of a sidewall of each of the apertures; and forming regions of amorphic diamond on the exposed portions of the conductive stripe.

2. The method of claim 1 wherein said step of forming regions of amorphic diamond comprises the step of forming regions of amorphic diamond by laser ablation.

3. The method of claim 1 wherein said step of forming regions of amorphic diamond comprises a step of forming region of amorphic diamond by laser plasma deposition.

4. The method of claim 1 wherein said step of forming a region of amorphic diamond comprises a step of forming a region of amorphic diamond by chemical vapor deposition.

5. The method of claim 1 wherein said step of forming a region of amorphic diamond comprises a step of forming a region of amorphic diamond by ion beam deposition.

6. The method of claim 1 wherein said step of forming a region of amorphic diamond comprises a step of forming a region of amorphic diamond by sputtering.

7. The method of claim 1 wherein said step of forming a region of amorphic diamond comprises a step of forming a region of amorphic diamond by low temperature deposition.

8. The method of claim 1 wherein said step of forming a region of amorphic diamond comprises a step of forming a region of amorphic diamond by evaporation.

9. The method of claim 1 wherein said step of forming a region of amorphic diamond comprises a step of forming a region of amorphic diamond by cathodic arc evaporation.

10. The method of claim 1 wherein said step of forming a region of amorphic diamond comprises a step of forming a region of amorphic diamond by laser acoustic wave deposition.

11. The method of claim 1 wherein said step of forming a region of amorphic diamond comprises a step of forming a region of amorphic diamond by magnetically separated cathodic arc evaporation.

12. The method of claim 1, wherein said regions of amorphic diamond have substantially flat emission surfaces.

13. The method of claim 1, wherein a plurality of portions of the conductive stripe are exposed by the plurality of apertures in the step of patterning and etching.

14. The method of claim 1, wherein the layer of insulator produces a plurality of spacers on the conductive stripe after the step of etching through the apertures.

15. The method of claim 14, wherein each of the plurality of spacers has a metal gate formed thereon.

16. The method of claim 1, wherein the step of forming regions of amorphic diamond produces a plurality of emitter regions on the conductive stripe.

17. The method of claim 16, wherein the plurality of emitter regions are separated by spacers formed from the layer of insulator as a result of the step of etching through the apertures.

18. The method of claim 1, wherein the patterning and etching step further comprises the steps of:

forming a mask of photoresist having a plurality of apertures therethrough on the layer of conductor wherein the apertures expose a plurality of regions of the layer of conductor;

etching the layer of conductor and the layer of insulator through the photoresist mask leaving a plurality of spacers formed on the conductive stripe; and removing the photoresist mask.

19. A method of fabricating a triode display cathode plate comprising the steps of:

forming a plurality of spaced apart conductive stripes on a face of a substrate;

forming a layer of insulator on the conductive stripes;

forming a layer of conductor on the insulator layer;

patterning and etching the layer of insulator and the layer of conductor to form a plurality of apertures exposing portions of the conductive stripes;

etching through the apertures to undercut portions of the layer of insulator forming a portion of a sidewall of each of the apertures; and forming regions of amorphic diamond on the exposed portions of the conductive stripes.

20. The method of claim 19 wherein the substrate comprises glass.

21. The method of claim 19 wherein the layer of insulator comprises silicon dioxide.

22. The method of claim 19 wherein the conductive stripes comprise chromium.

23. The method of claim 19 wherein the layer of conductor comprises titanium.

24. The method of claim 19 wherein the layer of conductor comprises tungsten.

25. The method of claim 19 wherein said step of etching through the apertures comprises a step of wet etching using a buffer-HF solution.

26. The method of claim 19 wherein said step of forming regions of amorphic diamond comprises a step of forming regions of amorphic diamond by laser ablation.

27. The method of claim 19, wherein said regions of amorphic diamond have substantially flat emission surfaces.

28. The method of claim 19, wherein a plurality of portions of each of the conductive stripes are exposed by the plurality of apertures.

29. The method of claim 19, wherein the layer of insulator forms a plurality of spacers on each of the conductive stripes after the step of etching through the apertures.

30. The method of claim 29, wherein each of the plurality of spacers has a metal gate formed thereon.

31. The method of claim 19, wherein the step of forming regions of amorphic diamond produces a plurality of emitter regions on each of the conductive stripes.

32. The method of claim 31, wherein the plurality of emitter regions are separated by spacers formed from the layer of insulator as a result of the step of etching through the apertures.

33. A method of fabricating a pixel of a triode pixel display cathode comprising the steps of:

forming a conductive stripe on a face of a substrate;

forming a layer of insulator on the conductive stripe;

forming a layer of conductor on the insulator layer;

patterning and etching the layer of insulator and the layer of conductor to form a plurality of apertures exposing portions of the conductive stripe;

etching through the apertures to undercut portions of the layer of insulator forming a portion of a sidewall of each of the apertures; and forming regions of low work function material on the exposed portions of the conductive stripe.

34. The method of claim 33, wherein said regions of amorphic diamond have substantially flat emission surfaces.

35. The method of claim 33, wherein the layer of insulator produces a plurality of spacers on the conductive stripe after the step of etching through the apertures.

36. The method of claim 35, wherein each of the plurality of spacers has a metal gate formed thereon.

37. The method of claim 33, wherein the step of forming regions of amorphic diamond produces a plurality of emitter regions on the conductive stripe.

38. The method of claim 37, wherein the plurality of emitter regions are separated by spacers formed from the layer of insulator as a result of the step of etching through the apertures.

* * * * *